United States Patent
Hiroki et al.

(10) Patent No.: US 11,742,461 B2
(45) Date of Patent: *Aug. 29, 2023

(54) SEMICONDUCTOR DEVICE

(71) Applicant: Nuvoton Technology Corporation Japan, Kyoto (JP)

(72) Inventors: Masanori Hiroki, Shiga (JP); Shigeo Hayashi, Kyoto (JP); Kenji Nakashima, Toyama (JP); Toshiya Fukuhisa, Osaka (JP); Keimei Masamoto, Niigata (JP); Atsushi Yamada, Toyama (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/860,776

(22) Filed: Jul. 8, 2022

(65) Prior Publication Data
US 2022/0344547 A1 Oct. 27, 2022

Related U.S. Application Data

(63) Continuation of application No. 17/506,244, filed on Oct. 20, 2021, now Pat. No. 11,417,805, which is a
(Continued)

(30) Foreign Application Priority Data

Feb. 1, 2018 (JP) ................................ 2018-016712

(51) Int. Cl.
*H01L 33/48* (2010.01)
*B23K 20/10* (2006.01)
(Continued)

(52) U.S. Cl.
CPC ............ *H01L 33/486* (2013.01); *B23K 20/10* (2013.01); *H01L 33/0095* (2013.01);
(Continued)

(58) Field of Classification Search
CPC ... H01L 33/486; H01L 33/0095; H01L 33/32; H01L 33/405; H01L 33/62;
(Continued)

(56) References Cited

U.S. PATENT DOCUMENTS 11,183,615 B2 * 11/2021 Hiroki ..................... H01L 33/40
11,417,805 B2 * 8/2022 Hiroki ..................... B23K 20/10
(Continued)

FOREIGN PATENT DOCUMENTS

JP     S63-276247 A     11/1988
JP     H06-005606 A     1/1994
(Continued)

OTHER PUBLICATIONS

International Search Report and Written Opinion dated Mar. 5, 2019 in International Application No. PCT/JP2018/047041; with partial English translation.
(Continued)

*Primary Examiner* — Su C Kim
(74) *Attorney, Agent, or Firm* — McDermott Will & Emery LLP

(57) ABSTRACT

A semiconductor device includes: a mounting board; and a semiconductor element disposed on the mounting board via metal bumps, wherein the semiconductor element includes a semiconductor stacked structure and first electrodes, the mounting board includes second electrodes, the metal bumps include a second layer in contact with the second electrodes of the semiconductor element and a first layer located on a side opposite to the second electrodes, an average crystal grain size of crystals included in the second
(Continued)

layer is larger than an average crystal grain size of crystals included in the first layer, and the first layer is spaced apart from the second electrodes of the semiconductor element.

18 Claims, 26 Drawing Sheets

Related U.S. Application Data continuation of application No. 16/966,393, filed as application No. PCT/JP2018/047041 on Dec. 20, 2018, now Pat. No. 11,183,615.

(51) Int. Cl.
*H01L 33/00* (2010.01)
*H01L 33/32* (2010.01)
*H01L 33/40* (2010.01)
*H01L 33/62* (2010.01)

(52) U.S. Cl.
CPC ............ *H01L 33/32* (2013.01); *H01L 33/405* (2013.01); *H01L 33/62* (2013.01)

(58) Field of Classification Search
CPC ... H01L 2224/16225; H01L 2933/0066; H01L 33/40; B23K 20/10
See application file for complete search history.

(56) References Cited

U.S. PATENT DOCUMENTS

| | | |
|---|---|---|
| 2004/0149999 A1 | 8/2004 | Uemura et al. |
| 2005/0132747 A1 | 6/2005 | Takemori et al. |
| 2005/0194690 A1* | 9/2005 | Ishii ........................ B23K 1/19 257/772 |
| 2009/0283787 A1 | 11/2009 | Donofrio et al. |
| 2010/0117114 A1 | 5/2010 | Suzuki et al. |
| 2010/0252855 A1 | 10/2010 | Kamei |
| 2011/0003470 A1* | 1/2011 | Burgess .................. H01L 24/11 257/E21.589 |
| 2011/0095330 A1 | 4/2011 | Saito et al. |
| 2013/0065331 A1 | 3/2013 | Koyama et al. |
| 2014/0042450 A1* | 2/2014 | Akiyama ................ H01L 33/40 438/27 |
| 2014/0322844 A1 | 10/2014 | Ichikawa et al. |
| 2015/0037917 A1 | 2/2015 | Hori et al. |
| 2015/0054174 A1* | 2/2015 | Lo ..................... H01L 23/53214 438/653 |
| 2015/0061115 A1 | 3/2015 | Chen et al. |
| 2015/0214201 A1 | 7/2015 | Schug |
| 2017/0103942 A1 | 4/2017 | Oi et al. |
| 2018/0053878 A1 | 2/2018 | Cich et al. |
| 2020/0365771 A1 | 11/2020 | Hiroki et al. |
| 2022/0052231 A1 | 2/2022 | Hiroki et al. |

FOREIGN PATENT DOCUMENTS

| | | |
|---|---|---|
| JP | H06-005609 A | 1/1994 |
| JP | H06-077232 A | 3/1994 |
| JP | 2000-340595 A | 12/2000 |
| JP | 2002-118137 A | 4/2002 |
| JP | 2002-134546 A | 5/2002 |
| JP | 2002-368271 A | 12/2002 |
| JP | 2003-273148 A | 9/2003 |
| JP | 2003-318363 A | 11/2003 |
| JP | 2005-123294 A | 5/2005 |
| JP | 2008-262993 A | 10/2008 |
| JP | 2009-218495 A | 9/2009 |
| JP | 2011-009429 A | 1/2011 |
| JP | 2011-181576 A | 9/2011 |
| JP | 2012-049296 A | 3/2012 |
| JP | 2014-038886 A | 2/2014 |
| JP | 2014-154749 A | 8/2014 |
| JP | 2014-232866 A | 12/2014 |
| JP | 2015-524623 A | 8/2015 |
| JP | 2017-073520 A | 4/2017 |
| JP | 2020-129683 A | 8/2020 |
| WO | 2009/063638 A1 | 5/2009 |
| WO | 2013/161247 A1 | 10/2013 |
| WO | 2014/024108 A1 | 2/2014 |

OTHER PUBLICATIONS

Notice of Reasons for Refusal issued in corresponding Japanese Patent Application No. 2019-553995, dated Nov. 19, 2019; with English translation.
Decision to Grant a Patent issued in corresponding Japanese Patent Application No. 2019-553995, dated Mar. 31, 2020; with English translation.
Japanese Office Action issued in Japanese Patent Application No. 2020-078211, dated Sep. 29, 2020.
Non-Final Office Action dated in U.S. Appl. No. 16/966,393, dated Feb. 25, 2021.
Notice of Allowance issued in U.S. Appl. No. 16/966,393, dated Jul. 21, 2021.
Notice of Reasons for Refusal issued in Japanese Patent Application No. JP 2020-078211, dated Sep. 18, 2020 with English translation.
Decision to Grant issued in Japanese Patent Application No. JP 2020-078211, dated Nov. 16, 2020; with English translation.
Notice of Reasons for Refusal dated Feb. 22, 2022 issued in the corresponding Japanese Patent Application No. JP 2020-211747, with English translation.
Non-Final Office Action issued in U.S. Appl. No. 17/506,244, dated Feb. 11, 2022.
Notice of Allowance issued in U.S. Appl. No. 17/506,244, dated Apr. 15, 2022.

* cited by examiner

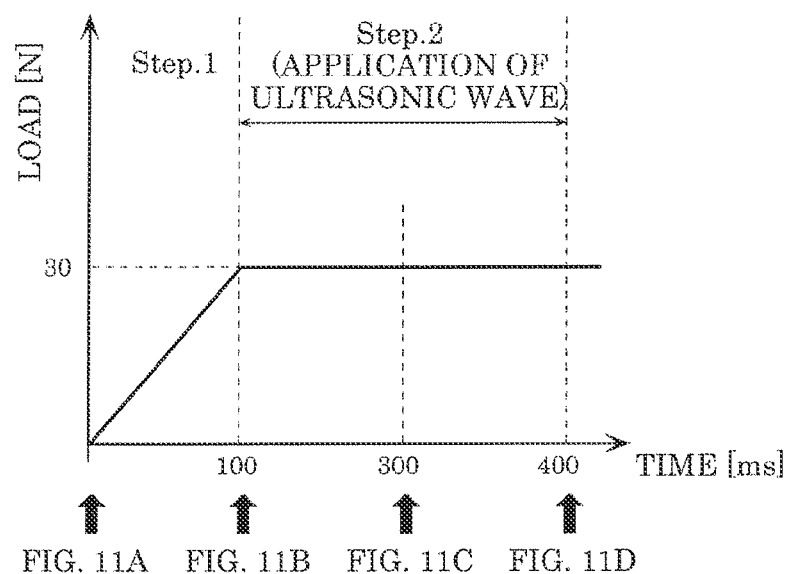

SEMICONDUCTOR DEVICE

CROSS-REFERENCE OF RELATED APPLICATIONS

This application is a Continuation of U.S. patent application Ser. No. 17/506,244, filed on Oct. 20, 2021, which is a Continuation of U.S. patent application Ser. No. 16/966,393, filed on Jul. 30, 2020, now U.S. Pat. No. 11,183,615, which is the U.S. National Phase under 35 U.S.C. § 371 of International Patent Application No. PCT/JP2018/047041, filed on Dec. 20, 2018, which in turn claims the benefit of Japanese Patent Application No. 2018-016712, filed on Feb. 1, 2018, the entire disclosures of which Applications are incorporated by reference herein.

TECHNICAL FIELD

The present disclosure relates to a semiconductor device, and more specifically, to a semiconductor device in which a semiconductor element and a mounting board are bonded by metal bumps.

BACKGROUND ART

Semiconductor light emitting devices such as LEDs (Light Emitting Diodes) are used as light sources for various devices. For example, LEDs are used for vehicle-mounted light sources of vehicle-mounted lighting devices such as DRL (Daytime Running Lights) and HL (Head Lamp). In particular, the market for vehicle-mounted light sources using high-power LEDs having a light output of 1 W or more is growing, and the use of LEDs replacing Halogen lamps or HID (High-Intensity Discharge) lamps is rapidly expanding.

Since there is an increasing demand for space-saving and improved design of vehicle-mounted light sources, downsizing, increased current, and integration for LEDs are progressing. Along with this, how to dissipate the heat generated by the LEDs is the key to ensuring the reliability required for the LEDs.

As a technique for bonding a semiconductor chip and a mounting board in order to realize downsizing, increased current, and integration of a semiconductor chip such as an LED chip, flip chip bonding for bonding the semiconductor chip to the mounting board in a face-down method. In this method, the semiconductor chip is flipped (turned over) and the wiring of the mounting board and the electrodes or wiring of the semiconductor chip are directly bonded using metal bumps. Compared with the case of bonding by the face-up method of connecting wires with the semiconductor wiring surface of the semiconductor chip facing upward, it is suitable for large current and high integration without being restricted by wire diameter and wire routing, and it is employed for vehicle-mounted light sources as a mounting method for high output applications.

In Patent Literature 1 (PTL 1), a semiconductor device in which an electrode pillar is connected to a semiconductor layer of a semiconductor element, and a tip of the electrode pillar is bonded to a wiring on a mounting board via solder is disclosed as a semiconductor device in which a semiconductor element and a mounting board are bonded by metal bumps by flip chip bonding.

FIG. 28 is a cross-sectional view of semiconductor device 200 disclosed in PTL 1.

As shown in FIG. 28, semiconductor device 200 includes semiconductor layer 210 including p-type layer 211, active layer 212 and n-type layer 213; p-side electrode 220 connected to p-type layer 211; and n-side electrode 230 connected to n-type layer 213; p-side seed layer 241 and p-side electrode pillar 242 stacked on p-side electrode 220; n-side seed layer 251 and the n-side electrode pillar 252 stacked on n-side electrode 230; and sealing resin body 260 that covers the aforementioned elements. In p-side electrode pillar 242 and n-side electrode pillar 252, the crystal grain size at the first end on the side of semiconductor layer 210 is smaller than the crystal grain size at the second end on the side opposite to semiconductor layer 210. As a result, as compared with the case where the crystal grain size is large in entire p-side electrode pillar 242 and n-side electrode pillar 252, it is possible to absorb the thermal stress and obtain semiconductor device 200 having high resistance to the thermal stress.

CITATION LIST

Patent Literature

PTL 1; Japanese Unexamined Patent Application Publication No. 2014-38886

SUMMARY OF THE INVENTION

Technical Problem

However, the semiconductor device disclosed in PTL 1 has such a problem that it is inferior in long-term reliability due to the occurrence of damage such as electrode defects in a long-term reliability test.

The present disclosure aims to provide a semiconductor device having excellent long-term reliability.

Solutions to Problem

One aspect of a first semiconductor device according to the present disclosure includes: a mounting board; and a semiconductor element disposed on the mounting board via metal bumps, wherein the semiconductor element includes a semiconductor stacked structure and first electrodes, the mounting board includes second electrodes, the metal bumps include a first layer in contact with the first electrodes and a second layer located on a side opposite to the first electrodes, an average crystal grain size of crystals included in the first layer is larger than an average crystal grain size of crystals included in the second layer, and the second layer is spaced apart from the first electrodes.

One aspect of a second semiconductor device according to the present disclosure includes: a mounting board; and a semiconductor element disposed on the mounting board via metal bumps, wherein the semiconductor element includes a semiconductor stacked structure and first electrodes, the mounting board includes second electrodes, the metal bumps include a first layer in contact with the first electrodes and a second layer located on a side opposite to the first electrodes, and the first layer has an equiaxed crystal grain structure.

One aspect of a third semiconductor device according to the present disclosure includes: a mounting board; and a semiconductor element disposed on the mounting board via metal bumps, wherein the semiconductor element includes a semiconductor stacked structure and first electrodes, the mounting board includes second electrodes, the metal bumps include a first layer that is in contact with the first electrodes and is comprising gold, and a second layer located on a side opposite to the first electrodes, an average crystal grain size of crystals included in the first layer is larger than an average crystal grain size of crystals included in the second layer, each of the first electrodes includes at least two layers including a surface layer comprising gold in contact with the metal bump, and a relational expression of $C>Rz/2+1-A*B/8$ is satisfied, where a thickness of the surface layer denotes A, an average crystal grain size of the surface layer denotes B, a thickness of the first layer denotes C, and a maximum height roughness of an interface between the first layer and the second layer denotes Rz.

One aspect of a fourth semiconductor device according to the present disclosure includes: a mounting board; and a semiconductor element disposed on the mounting board via metal bumps, wherein the semiconductor element includes a semiconductor stacked structure and first electrodes, the mounting board includes second electrodes, when a virtual rectangle having a same area and a same height as a cross-sectional shape of the metal bumps is defined in a cross-section of the semiconductor element, the mounting board and the metal bumps in a direction perpendicular to the mounting board, at least one of a width of a first bonding portion which is a bonding portion between the first layer in contact with the first electrodes and the first electrodes or a width of a second bonding portion which is a bonding portion between the third layer and the second electrodes is longer than the length of the bottom of the rectangle.

Advantageous Effect of Invention

According to the present disclosure, when bonding a semiconductor element and a mounting board via metal bumps, it is possible to suppress the occurrence of defects due to the bonding of the metal bumps, such as damage and peeling of the electrode, and it is possible to realize a semiconductor device having excellent long-term reliability.

BRIEF DESCRIPTION OF DRAWINGS

FIG. 10 is a timing chart of the ultrasonic bonding when a semiconductor element is mounted on a mounting board in Embodiment 1.

DESCRIPTION OF EXEMPLARY EMBODIMENTS (Background of Obtaining One Aspect of the Present Disclosure)

As semiconductor light emitting elements such as LEDs have become smaller and have a larger current, the required level of reliability required for semiconductor devices such as semiconductor light emitting devices having semiconductor light emitting elements has been increasing.

According to the semiconductor device disclosed in PTL 1, it is said that a semiconductor device having high resistance to thermal stress can be obtained. However, it has been found in the study by the inventors of the present application that damage such as electrode failure occurred in the long-term reliability test with the downsizing and increased current of semiconductor light emitting elements. It is considered that this is because the stress generated when the metal bumps are compressed and bonded causes distortion in the electrodes of the semiconductor light emitting element, which causes a defective electrode or the like.

Figure 29A:
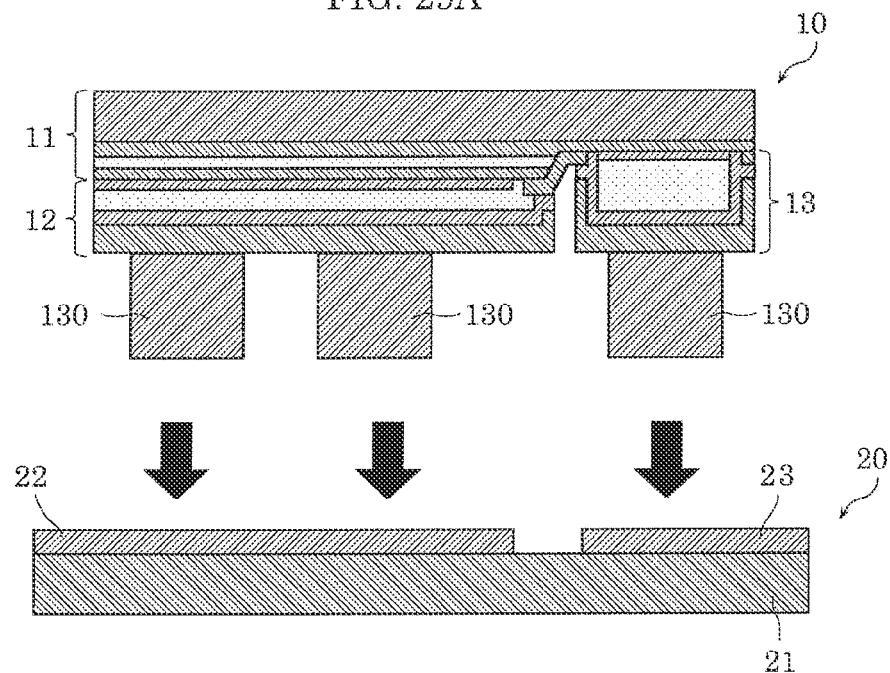
FIG. 29A is a cross-sectional view of a semiconductor device of a comparative example in which a semiconductor element is mounted on a mounting board by flip chip bonding (in a state before flip chip bonding).
Figure 29B:
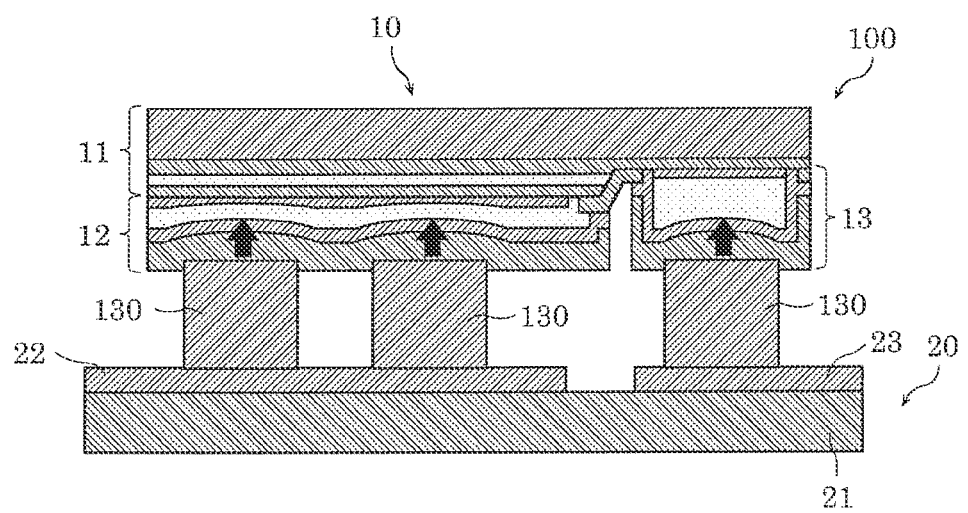
FIG. 29B is a cross-sectional view of a semiconductor device of a comparative example in which a semiconductor element is mounted on a mounting board by flip chip bonding (in a state after flip chip bonding).

Here, the factors that cause distortion in the electrodes of the semiconductor light emitting element will be described with reference to FIG. 29A and FIG. 29B. FIG. 29A and FIG. 29B are cross-sectional views of semiconductor device 100 of a comparative example in which semiconductor element 10 is mounted on mounting board 20 by flip chip bonding. FIG. 29A shows a state before flip chip bonding, and FIG. 29B shows a state after flip chip bonding.

Figure 28:
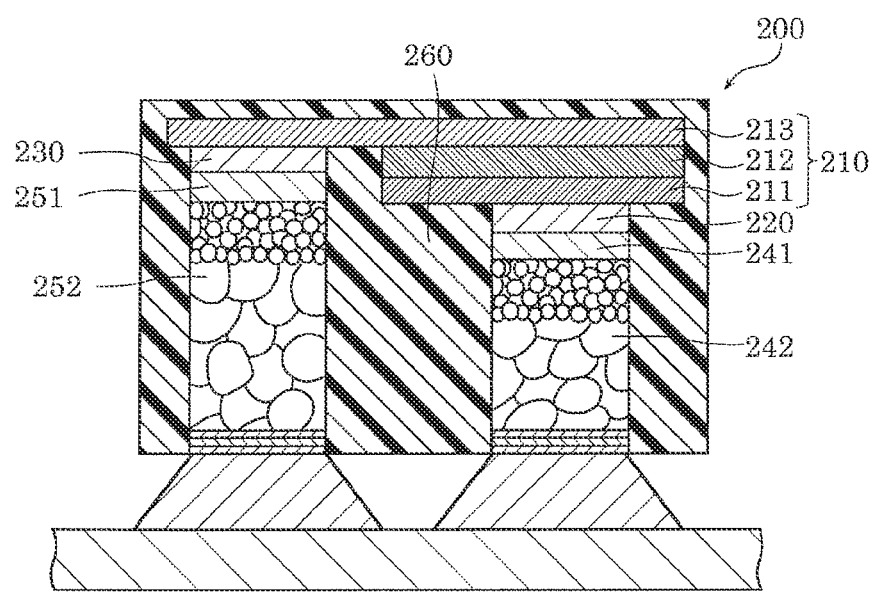
FIG. 28 is a cross-sectional view of a semiconductor device disclosed in PTL 1.

As shown in FIG. 29B, semiconductor device 100 includes semiconductor element 10 having semiconductor stacked structure 11 and mounting board 20. Semiconductor element 10 and mounting board 20 are bonded via metal bumps 130. Specifically, the first electrodes (first p-side electrode 12, first n-side electrode 13) formed in semiconductor stacked structure 11 of semiconductor element 10 and the second electrodes (second p-side electrode 22, second n-side electrode 23) of mounting board 20 are bonded via metal bumps 130. Metal bumps 130 correspond to p-side electrode pillar 242 and n-side electrode pillar 252 of semiconductor device 200 disclosed in PTL 1 of FIG. 28.

When mounting semiconductor element 10 on mounting board 20, semiconductor element 10 (for example, LED) is disposed in a direction in which the second electrodes (second p-side electrode 22, second n-side electrode 23) disposed on mounting board 20 and metal bumps 130 formed on the first electrodes (first p-side electrode 12, first n-side electrode 13) of semiconductor element 10 face each other as shown in FIG. 29A. Thereafter, the gold on the outermost surface of the second electrodes of mounting board 20 and the gold on the outermost surface of metal bumps 130 are ultrasonically bonded by applying an ultrasonic wave while pressing by applying a load from semiconductor element 10 side to mounting board 20 side (in the direction perpendicular to mounting board 20). As a result, semiconductor element 10 and mounting board 20 are bonded via metal bumps 130.

However, it has been found that metal bumps 130 are pressed against the first electrodes (first p-side electrode 12, first n-side electrode 13) on semiconductor element 10 side due to the pressing of the load at the time of mounting, and distortion occurs in the first electrodes of semiconductor element 10. The distortion of the electrode of semiconductor element 10 appears as a crack or a bump mark on the first electrodes of semiconductor element 10, and causes an electrode failure during a long-term reliability test.

With the downsizing and increased current of semiconductor elements, especially LEDs, it is becoming more and more important to develop electrodes and bumps that do not leave distortion during mounting while maintaining the strength when mounting the semiconductor elements. It should be noted that PTL 1 does not describe a problem related to mechanical stress, which is a problem of the present disclosure.

Therefore, the inventors of the present application have studied a structure and a construction method in which, even when a semiconductor element is mounted on a mounting board via metal bumps by flip chip bonding, no distortion occurs in electrodes and bumps of the semiconductor element during mounting.

Then, as a result of repeated studies by the inventors of the present application, in a semiconductor device in which a semiconductor element and a mounting board are bonded via metal bumps, it has been found that it is possible to absorb and alleviate the impact during mounting by the metal bumps to suppress the damage to the electrodes of the semiconductor element by providing the first layer that is in contact with the electrodes of the semiconductor element and the second layer that is in contact with the first layer and making the crystal grain size of one of the first layer and the second layer larger than the crystal grain size of the other thereof.

Furthermore, it has also been found that by forming a portion of the metal bump that is in contact with the electrode of the semiconductor element (or the mounting board) with a soft layer, the soft layer is deformed by the pressure at the time of mounting so that the bonding portion of at least one of the semiconductor element side or the mounting board side can become a wide bottom shape to increase the bonding area between the metal bump and the electrode of the semiconductor element (or the mounting electrode) to increase the bonding strength between the metal bump and the electrode of the semiconductor element.

The semiconductor device according to the present disclosure is made based on such an idea.

Specifically, a first semiconductor device according to the present disclosure includes: a mounting board; and a semiconductor element disposed on the mounting board via a metal bump, wherein the semiconductor element includes a semiconductor stacked structure and first electrodes, the mounting board includes second electrodes, the metal bump includes a first layer in contact with the first electrodes and a second layer located on a side opposite to the first electrodes, an average crystal grain size of crystals included in the first layer is larger than an average crystal grain size of crystals included in the second layer, and the second layer is spaced apart from the first electrodes.

In addition, in the first semiconductor device according to the present disclosure, the first layer may include, on a side of the second layer, a transition region in which an average crystal grain size approaches from the average crystal grain size of the first layer to the average crystal grain size of the second layer.

In addition, in the first semiconductor device according to the present disclosure, a maximum height roughness of an interface between the first layer and the second layer may be equal to or larger than the average crystal grain size of the second layer.

In this case, the average crystal grain size of the first layer may be equal to or larger than the maximum height roughness of the interface.

In addition, in the first semiconductor device according to the present disclosure, each of the first electrodes includes at least two layers including a surface layer comprising gold in contact with the metal bump, and a relational expression of $C > Rz/2 + 1 - A*B/8$ may be satisfied, where a thickness of the surface layer denotes A, an average crystal grain size of the surface layer denotes B, a thickness of the first layer denotes C, and a maximum height roughness of an interface between the first layer and the second layer denotes Rz.

In addition, in the first semiconductor device according to the present disclosure, the first layer may have an equiaxed crystal grain structure.

In addition, in the first semiconductor device according to the present disclosure, the second layer may have a multi-axial crystal grain structure.

In addition, in the first semiconductor device according to the present disclosure, when a virtual rectangle having a same area and a same height as a cross-sectional shape of the metal bump is defined in a cross-section of the semiconductor element, the mounting board and the metal bump in a direction perpendicular to the mounting board, a width of a first bonding portion which is a bonding portion between the first layer in contact with the first electrodes and the first electrodes may be longer than the length of the bottom of the rectangle.

In addition, in the first semiconductor device according to the present disclosure, the metal bump includes a third layer in contact with the second electrodes, when a virtual rectangle having a same area and a same height as a cross-sectional shape of the metal bump is defined in a cross-section of the semiconductor element, the mounting board and the metal bump in a direction perpendicular to the mounting board, a width of a second bonding portion which is a bonding portion between the third layer and the second electrodes may be longer than the length of the bottom of the rectangle.

In addition, in the first semiconductor device according to the present disclosure, the second layer may have a width shorter than the length of the bottom of the rectangle.

In addition, in the first semiconductor device according to the present disclosure, the semiconductor stacked structure may include a substrate, and a first conductive type semiconductor layer, an active layer and a second conductive type semiconductor layer, which are sequentially stacked from a side of the substrate.

In addition, in the first semiconductor device according to the present disclosure, the first electrodes may be disposed in contact with the second conductive type semiconductor layer and include a metal film that reflects light from the active layer.

In addition, a second semiconductor device according to the present disclosure includes: a mounting board; and a semiconductor element disposed on the mounting board via a metal bump, wherein the semiconductor element includes a semiconductor stacked structure and first electrodes, the mounting board includes second electrodes, the metal bump includes a first layer in contact with the first electrodes and a second layer located on a side opposite to the first electrodes, and the first layer has an equiaxed crystal grain structure.

In addition, in the second semiconductor device according to the present disclosure, the second layer may have a multiaxial crystal grain structure.

In addition, a third semiconductor device according to the present disclosure includes: a mounting board; and a semiconductor element disposed on the mounting board via a metal bump, wherein the semiconductor element includes a semiconductor stacked structure and first electrodes, the mounting board includes second electrodes, the metal bump includes a first layer that is in contact with the first electrodes and is comprising gold, and a second layer located on a side opposite to the first electrodes, an average crystal grain size of crystals included in the first layer is larger than an average crystal grain size of crystals included in the second layer, each of the first electrodes includes at least two layers including a surface layer comprising gold in contact with the metal bump, and a relational expression of $C>Rz/2+1-A*B/8$ is satisfied, where a thickness of the surface layer denotes A, an average crystal grain size of the surface layer denotes B, a thickness of the first layer denotes C, and a maximum height roughness of an interface between the first layer and the second layer denotes Rz.

In addition, a fourth semiconductor device according to the present disclosure includes: a mounting board; and a semiconductor element disposed on the mounting board via a metal bump, wherein the semiconductor element includes a semiconductor stacked structure and first electrodes, the mounting board includes second electrodes, when a virtual rectangle having a same area and a same height as a cross-sectional shape of the metal bump is defined in a cross-section of the semiconductor element, the mounting board and the metal bump in a direction perpendicular to the mounting board, at least one of a width of a first bonding portion which is a bonding portion between the first layer in contact with the first electrodes and the first electrodes or a width of a second bonding portion which is a bonding portion between the third layer and the second electrodes is longer than the length of the bottom of the rectangle.

In addition, in the fourth semiconductor device according to the present disclosure, the metal bump may include a second layer having a width shorter than the length of the bottom of the rectangle between the first layer and the third layer.

EMBODIMENTS

Hereinafter, embodiments of the present disclosure will be described with reference to the drawings. It should be noted that each of the embodiments described below shows a specific example of the present disclosure. Therefore, the numerical values, shapes, materials, components, arrangement positions and connection forms of components, steps and order of steps, and the like shown in the following embodiments are examples, and are not intended to limit the present disclosure. Therefore, among the components in the following embodiments, the components that are not described in the independent claims showing the highest concept of the present disclosure will be described as arbitrary components.

In addition, each drawing is a schematic view and is not necessarily strictly illustrated. Therefore, the scales and the like do not necessarily match in each drawing. It should be noted that the same reference numerals are given to substantially the same configurations in each drawing, and overlapping description will be omitted or simplified.

Embodiment 1

[Semiconductor Device]

Figure 1:
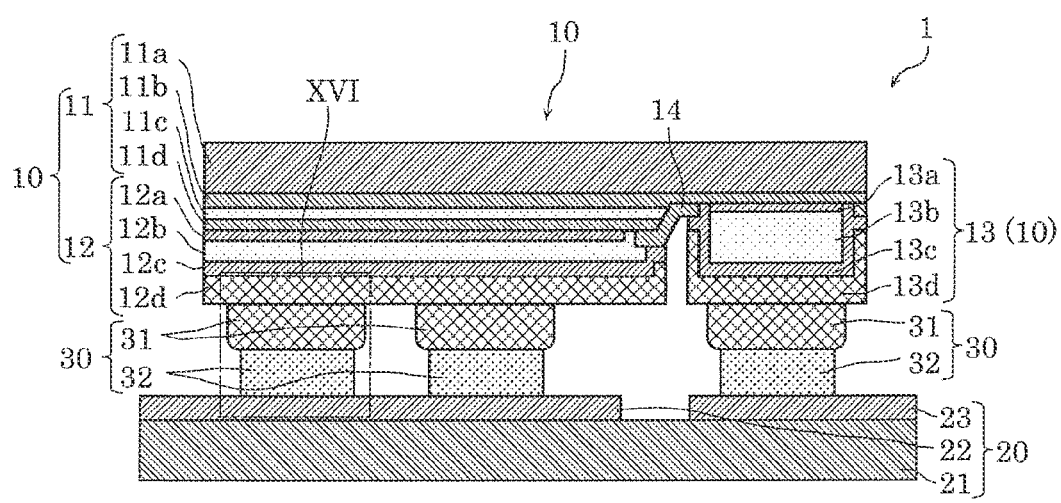
FIG. 1 is a cross-sectional view of a semiconductor device according to Embodiment 1.

First, the configuration of semiconductor device 1 according to Embodiment 1 will be described with reference to FIG. 1. FIG. 1 is a cross-sectional view of semiconductor device 1 according to Embodiment 1.

As shown in FIG. 1, semiconductor device 1 according to Embodiment 1 includes semiconductor element 10, mounting board 20, and metal bumps 30.

Semiconductor element 10 is disposed on mounting board 20 via metal bumps 30. That is, semiconductor element 10 is bonded to mounting board 20 via metal bumps 30.

In the present embodiment, semiconductor element 10 is a light emitting diode (LED) chip. Therefore, semiconductor device 1 is a semiconductor light emitting device including an LED chip.

Semiconductor element 10 has semiconductor stacked structure 11, and first p-side electrode 12 and first n-side electrode 13 formed on semiconductor stacked structure 11 as the first electrodes. Each of first p-side electrode 12 and first n-side electrode 13 includes at least two layers including a surface layer comprising gold that is in contact with a metal bump 30.

It should be noted that in the present specification, first p-side electrode 12 and first n-side electrode 13 may be collectively referred to as the first electrodes of semiconductor element 10 unless it is necessary to distinguish between them.

Semiconductor stacked structure 11 includes substrate 11a, n-type semiconductor layer 11b (first conductivity type semiconductor layer), active layer 11c, and p-type semiconductor layer 11d (second conductivity type semiconductor layer). N-type semiconductor layer 11b, active layer 11c, and p-type semiconductor layer 11d are included in a semiconductor stacked body that is in contact with substrate 11a, and are stacked in this order from the substrate 11a side. Specifically, n-type semiconductor layer 11b, active layer 11c, and p-type semiconductor layer 11d are stacked in this order above substrate 11a.

First p-side electrode 12 and first n-side electrode 13 are formed on semiconductor stacked structure 11. First p-side electrode 12 is formed on p-type semiconductor layer 11d. In addition, first n-side electrode 13 is formed on n-type semiconductor layer 11b. Specifically, first n-side electrode 13 is formed in an exposed region where n-type semiconductor layer 11b is partially exposed by removing a part of p-type semiconductor layer 11d and active layer 11c.

In the present embodiment, oxide film 14 is formed as an insulating film on semiconductor stacked structure 11. First p-side electrode 12 is formed on p-type semiconductor layer 11d exposed from the opening of oxide film 14, and first n-side electrode 13 is formed on n-type semiconductor layer 11b exposed from the opening of oxide film 14.

First p-side electrode 12 has reflective electrode 12a, barrier electrode 12b, seed layer 12c, and cover electrode 12d, which are sequentially stacked from the semiconductor stacked structure 11 side. Specifically, reflective electrode 12a, barrier electrode 12b, seed layer 12c, and cover electrode 12d are stacked above semiconductor stacked structure 11 in this order. In first p-side electrode 12, reflective electrode 12a is a metal film that reflects light from active layer 11c of semiconductor stacked structure 11, and is disposed in contact with p-type semiconductor layer 11d (second conductivity type semiconductor layer) of semiconductor stacked structure 11.

In addition, first n-side electrode 13 has ohmic contact layer 13, barrier electrode 13b, seed layer 13c, and cover electrode 13d, which are sequentially stacked from the semiconductor stacked structure 11 side.

In addition, in first p-side electrode 12 and first n-side electrode 13, cover electrodes 12d and 13d are surface layers comprising gold that are in contact with metal bumps 30. Specifically, cover electrodes 12d and 13d are gold plating films formed on seed layers 12c and 13c as underlying layers.

Mounting board 20 includes substrate 21, and second p-side electrode 22 and second n-side electrode 23 formed on one surface of substrate 21 as the second electrodes. Second p-side electrode 22 and second n-side electrode 23 are extraction electrodes for applying a current to semiconductor element 10.

Second p-side electrode 22 is bonded to first p-side electrode 12 of semiconductor element 10 via metal bumps 30. Similarly on the n-side, second n-side electrode 23 is bonded to first n-side electrode 13 of semiconductor element 10 via metal bump 30.

It should be noted that in the present specification, second p-side electrode 22 and second n-side electrode 23 may be collectively referred to as the second electrodes of mounting board 20 unless it is necessary to distinguish them.

Metal bump 30 is formed on semiconductor element 10. P-side metal bump 30 and n-side metal bump 30 are the metal bumps with the same configuration. That is, metal bump 30 between first p-side electrode 12 of semiconductor element 10 and second p-side electrode 22 of mounting board 20, and metal bumps 30 between first n-side electrode 13 of semiconductor element 10 and second n-side electrode 23 of mounting board 20 have the same configuration. In the present embodiment, metal bump 30 is a gold bump comprising a gold plating film.

Specifically, metal bump 30 includes a plurality of metal layers including first layer 31 located on the first electrodes (first p-side electrode 12, first n-side electrode 13) side, and second layer 32 located on the opposite side to the first electrodes. In the present embodiment, metal bump 30 has two layers of first layer 31 and second layer 32.

First layer 31 is in contact with the first electrodes (first p-side electrode 12, first n-side electrode 13). Specifically, first layer 31 is directly bonded to cover electrode 12d of first p-side electrode 12 or cover electrode 13d of first n-side electrode 13.

On the other hand, second layer 32 is in contact with first layer 31 and also with the second electrodes (second p-side electrode 22 and second n-side electrode 23) of mounting board 20. Specifically, second layer 32 is directly bonded to second p-side electrode 22 or second n-side electrode 23. Therefore, second layer 32 is spaced apart from the first electrodes (first p-side electrode 12, first n-side electrode 13). Specifically, first layer 31 exists between second layer 32 and the first electrodes.

It should be noted that the width of first layer 31 is larger than that of second layer 32. In the present embodiment, both first layer 31 and second layer 32 have a substantially columnar shape, but first layer 31 has a columnar shape having a diameter larger than that of second layer 32.

Figure 2:
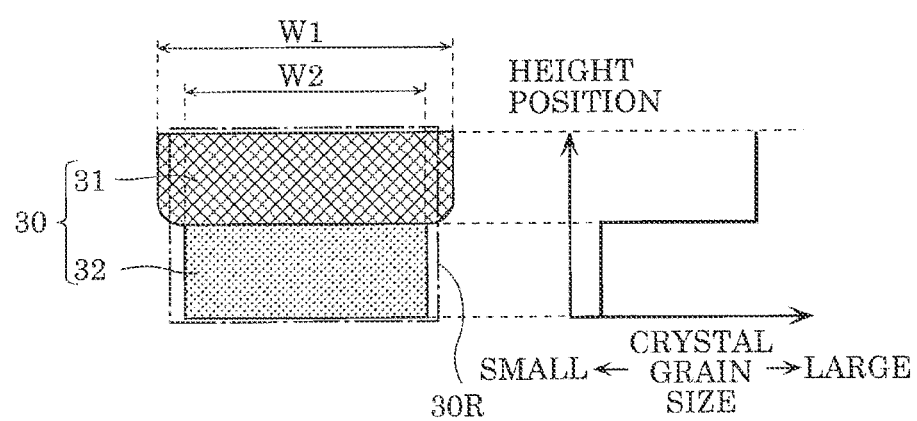
FIG. 2 is an enlarged cross-sectional view of a metal bump of the semiconductor device according to Embodiment 1 and a diagram showing the height position dependence of the crystal grain size in the metal bump.

FIG. 2 is an enlarged cross-sectional view of metal bump 30 of semiconductor device 1 according to Embodiment 1 and a diagram showing the height position dependence of the crystal grain size in metal bump 30. In FIG. 2, the vertical axis represents the height position of metal bump 30, and the horizontal axis represents the crystal grain size of metal bump 30.

As shown in FIG. 2, in metal bump 30, the average crystal grain size of the crystals included in first layer 31 is larger than the average crystal grain size of the crystals included in second layer 32. That is, metal bump 30 includes first layer 31 and second layer 32 having different metal crystal grain sizes.

Here, the relationship between the crystal grain size and the hardness of the metal will be described. Generally, there is a negative correlation between the crystal grain size of metal and the hardness. That is, the hardness increases as the crystal grain size decreases. On the contrary, the hardness decreases as the crystal grain size increases. This is because the hardness of metal is determined by the amount of plastic deformation of the metal when a load is applied, and the amount of plastic deformation is influenced by obstacles against multiplication and migration of dislocation, obstacles against migration, slip plane length and metal crystal orientation.

The slip plane of the metal crystal is determined in a specific direction of the crystal lattice, and when stress is applied, slip occurs in that direction and the metal is plastically deformed. That is, a metal crystal body having a large crystal grain size has a long slip line, and when stress is applied, the stress concentrates on the crystal boundary and is prone to plastic deformation in the vicinity thereof. That is, it is soft.

On the contrary, in a metal crystal body having a small crystal grain size, the slip surface length of a single grain is small, and when a certain stress is applied, many slip surfaces do not coincide with the stress direction. As a result, those crystals become a resistance and slip is less likely to occur, and the metal is less likely to be plastically deformed. That is, a metal crystal body having a small crystal grain size is hard.

The relationship between the crystal grain size and the hardness is the same for the gold plating film as described later. That is, there is also a negative correlation between the crystal grain size and the hardness in metal bump 30 comprising a gold plating film. That is, the larger the average crystal grain size of the crystals included in the gold plating film, the lower the hardness.

Then, in metal bump 30 according to the present embodiment, the crystal grain size of first layer 31 becomes coarse due to recrystallization caused by heating after plating. That is, first layer 31 having a relatively large average crystal grain size of crystals is softer than second layer 32 having a relatively small average crystal grain size of crystals in metal bump 30.

In semiconductor device 1 configured in this way, when mounting semiconductor element 10 on which metal bumps 30 are formed on mounting board 20, metal bumps 30 can alleviate the impact between semiconductor element 10 and mounting board 20. As a result, when semiconductor element 10 is mounted on mounting board 20, it is possible to prevent the first electrodes (first p-side electrode 12 and first n-side electrode 13) of semiconductor element 10 from being damaged.

[Method for Manufacturing Semiconductor Device]

Next, a method for manufacturing semiconductor device 1 according to Embodiment 1 will be described with reference to the drawings.

A method for manufacturing semiconductor device 1 according to Embodiment 1 includes a first step (FIGS. 3A to 3B) of forming semiconductor stacked structure 11 of semiconductor element 10, then a second step (FIGS. 4A to 4I) of forming first electrodes of semiconductor element 10, then a third step (FIGS. 5A to 5D) of forming metal bumps 30 on semiconductor element 10, and then a fourth step (FIGS. 6A to 6B) of mounting semiconductor element 10 is on mounting board 20 by flip chip bonding.

[First Step (Semiconductor Stacked Structure Forming Step)]

Figure 3A:
FIG. 3A is a diagram showing a step of preparing a substrate in the first step of a method for manufacturing the semiconductor device according to Embodiment 1.
Figure 3B:
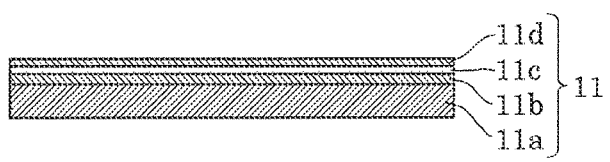
FIG. 3B is a diagram showing a step of forming a semiconductor stacked structure in the first step of the method for manufacturing the semiconductor device according to Embodiment 1.

First, semiconductor stacked structure 11 of semiconductor element 10 is formed by the flow shown in FIGS. 3A to 3B. FIGS. 3A to 3B are diagrams showing a flow for forming semiconductor stacked structure 11 of semiconductor element 10.

Specifically, first, substrate 11a is prepared as shown in FIG. 3A. In the present embodiment, a wafer comprising GaN (GaN substrate) is used for substrate 11a as a translucent substrate comprising a semiconductor.

Next, semiconductor stacked structure 11 can be formed by sequentially depositing n-type semiconductor layer 11b, active layer 11c, and p-type semiconductor layer 11d on substrate 11a by an epitaxial growth technique using a MOVPE (Metal Organic Vapor Phase Epitaxy) method as shown in FIG. 3B.

In the present embodiment, n-type semiconductor layer 11b is an n-type nitride semiconductor layer (for example, a GaN layer), active layer 11c is a nitride light emitting layer, and p-type semiconductor layer 11d is a p-type nitride semiconductor layer. The nitride light emitting layer included in active layer 11c includes at least Ga and N, and includes a proper amount of In, if necessary, thereby a desired light emission wavelength can be obtained. In the present embodiment, active layer 11c is an InGaN layer, and the In composition ratio is set so that the light emission peak wavelength is 450 nm.

[Second Step (First Electrode Forming Step)]

Next, the first electrodes (first p-side electrode 12, first n-side electrode 13) of semiconductor element 10 is formed by the flow shown in FIGS. 4A to 4I. FIGS. 4A to 4I are diagrams showing a flow for forming the first electrodes of semiconductor element 10.

Specifically, first, a part of n-type semiconductor layer 11b is exposed from p-type semiconductor layer 11d and active layer 11c by removing a part of p-type semiconductor layer 11d, active layer 11c, and n-type semiconductor layer 11b by dry etching from semiconductor stacked structure 11 formed in the first step described above, as shown in FIG. 4A. Thereby, the exposed region can be formed in a part of n-type semiconductor layer 11b.

Figure 4A:
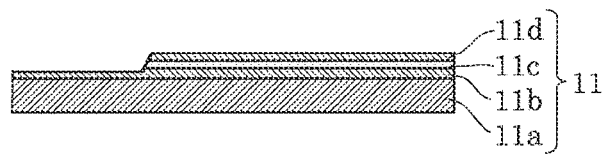
FIG. 4A is a diagram showing a step of etching the semiconductor stacked structure in the second step of the method for manufacturing the semiconductor device according to Embodiment 1.
Figure 4B:
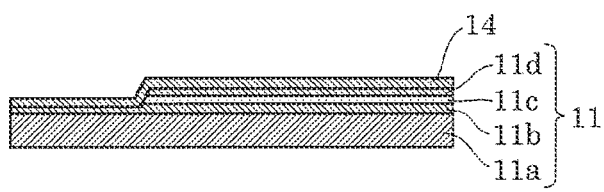
FIG. 4B is a diagram showing a step of forming an insulating film in the second step of the method for manufacturing the semiconductor device according to Embodiment 1.

Next, oxide film 14 is formed as an insulating film over the entire top surface of semiconductor stacked structure 11 including the exposed region of n-type semiconductor layer 11b, as shown in FIG. 4B.

Thereafter, although not shown, a resist is applied on oxide film 14, an opening is formed in the resist at a position corresponding to the exposed region of n-type semiconductor layer 11b by photolithography, and oxide film 14 in the opening of the resist is removed by etching with hydrofluoric acid.

Figure 4C:
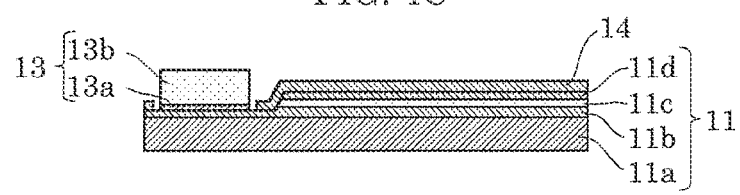
FIG. 4C is a diagram showing a step of forming an ohmic contact layer and a barrier electrode of the first n-side electrode in the second step of the method for manufacturing the semiconductor device according to Embodiment 1.

Next, as shown in FIG. 4C, an n-side electrode forming material for forming first n-side electrode 13 is deposited using an EB (Electron Beam) vapor deposition method, and by removing the resist and the extra n-side electrode forming material by a resist liftoff method, a part of first n-side electrode 13 is formed in the region where oxide film 14 has been removed.

In the present embodiment, an Al layer (film thickness of 0.3 μm) to be ohmic contact layer 13a and a Ti electrode (film thickness of 0.1 μm) to be barrier electrode 13b are sequentially deposited as the n-side electrode forming material in the direction away from the side close to n-type semiconductor layer 11b. Thereby, a stacked structure layer of ohmic contact layer 13a comprising the Al layer and barrier electrode 13b comprising the Ti layer can be formed as a part of first n-side electrode 13.

It should be noted that the Al layer of first n-side electrode 13 directly stacked on n-type semiconductor layer 11b functions as an ohmic contact layer for n-type semiconductor layer 11b. The material of the ohmic contact layer can be, for example, Ti, V, Al, an alloy containing any one of these metals or the like. In addition, the Ti layer used for barrier electrode 13b functions as a barrier for preventing the lower Al layer from reacting with the upper Au layer that will be formed in a later step.

Thereafter, although not shown, a resist is applied so as to cover first n-side electrode 13 and oxide film 14, an opening is formed in the resist of p-type semiconductor layer 11d by photolithography, and oxide film 14 in the opening of the resist is removed by etching with hydrofluoric acid.

Figure 4D:
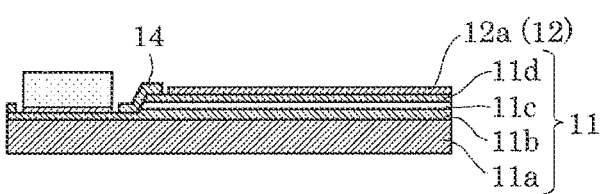
FIG. 4D is a diagram showing a step of forming a reflective electrode of the first p-side electrode in the second step of the method for manufacturing the semiconductor device according to Embodiment 1.

Next, as shown in FIG. 4D, a p-side electrode forming material for forming first p-side electrode 12 is deposited using the EB vapor deposition method, and by removing the resist and the extra p-side electrode forming material with the resist lift-off method, reflective electrode 12a, which is a part of first p-side electrode 12, is formed in the region where oxide film 14 has been removed on p-type semiconductor layer 11d.

In the present embodiment, an Ag layer having a film thickness of 0.2 µm is deposited as reflective electrode 12a (p-side electrode forming material) comprising an Ag layer. At this time, reflective electrode 12a is formed so as to be spaced apart from oxide film 14. In other words, reflective electrode 12a is formed so that p-type semiconductor layer 11d is exposed between reflective electrode 12a and oxide film 14.

It should be noted that a metal film comprising a metal material containing Ag, Al, and Rh, which has a high reflectance for reflecting the light of active layer 11c, may be used for reflective electrode 12a. In addition, the depositing method of reflective electrode 12a is not limited to the EB vapor deposition method, and may be a sputtering method.

Figure 4E:
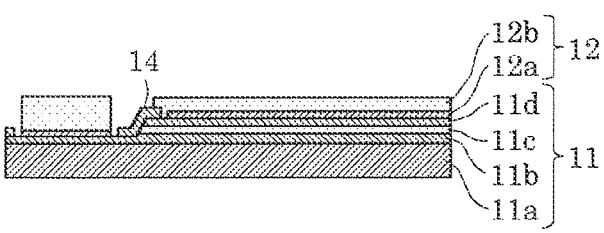
FIG. 4E is a diagram showing a step of forming a barrier electrode of the first p-side electrode in the second step of the method for manufacturing the semiconductor device according to Embodiment 1.

Next, as shown in FIG. 4E, barrier electrode 12b is formed so as to cover the upper surface and the side surface of reflective electrode 12a. In the present embodiment, a Ti layer having a thickness of 0.8 µm is formed as barrier electrode 12b by using a sputtering method. As a material of barrier electrode 12b, Ti, Ni, Pt, TiW, or the like may be used to protect reflective electrode 12a. At this time, barrier electrode 12b is formed so as to cover (i) p-type semiconductor layer 11d exposed between oxide film 14 and reflective electrode 12a and (ii) the end of oxide film 14 on n-type semiconductor layer 11b.

Figure 4F:
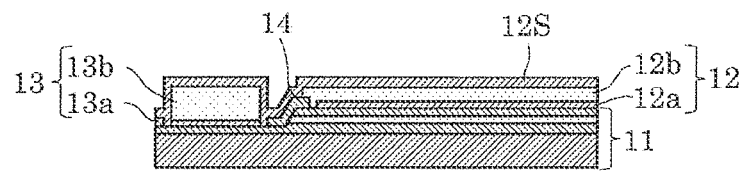
FIG. 4F is a diagram showing a step of forming a seed film in the second step of the method for manufacturing the semiconductor device according to Embodiment 1.

Next, as shown in FIG. 4F, seed film 12S is formed by the EB vapor deposition method on the entire surface of the wafer on which barrier electrode 12b of first p-side electrode 12 and barrier electrode 13b of first n-side electrode 13 have been formed. Seed film 12S is a metal film to be seed layer 12c of first p-side electrode 12 and seed layer 13c of first n-side electrode 13, and is used as a base electrode for gold plating. In the present embodiment, seed film 12S is a stacked structure layer in which a Ti layer and an Au layer are stacked in the direction away from the side close to barrier electrodes 12b and 13b.

Figure 4G:
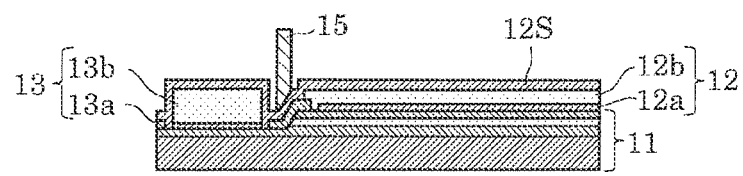
FIG. 4G is a diagram showing a step of forming a resist in the second step of the method for manufacturing the semiconductor device according to Embodiment 1.

Next, as shown in FIG. 4G, resist 15 is formed on seed film 12S in the boundary region between barrier electrode 12b corresponding to first p-side electrode 12 and barrier electrode 13b corresponding to first n-side electrode 13.

Figure 4H:
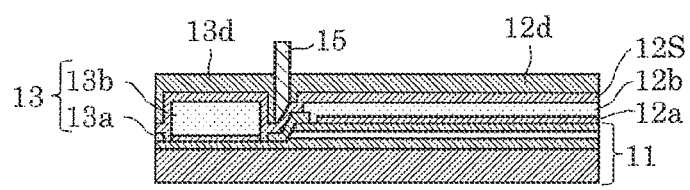
FIG. 4H is a diagram showing a step of forming cover electrodes for the first p-side electrode and the first n-side electrode in the second step of the method for manufacturing the semiconductor device according to Embodiment 1.

Next, as shown in FIG. 4H, cover electrodes 12d and 13d which are gold plating films are formed by depositing a metal with electrolytic plating using seed film 12S as a base electrode in a region where resist 15 is not formed (resist non-forming region) on the wafer. Cover electrode 12d is formed on seed film 12S on barrier electrode 12b, and cover electrode 13d is formed on seed film 12S on barrier electrode 13b. By using a non-cyan type Au plating solution having a plating solution temperature of 50° C. and setting the deposition rate to 0.5 µm/min as an example of conditions for forming a plating film as cover electrodes 12d and 13d, a gold plating film having a thickness of 1.0 µm is formed as cover electrodes 12d and 13d.

Here, Au or a material containing Au is used for cover electrodes 12d and 13d in order to enhance corrosion resistance. In addition, when semiconductor element 10 is viewed in plan from the cover electrode 12d (cover electrode 13d) side, cover electrode 12d is formed so as to include barrier electrode 12b, and cover electrode 13d is formed so as to include barrier electrode 13b. It should be noted that oxide film 14 is disposed on the semiconductor stacked structure 11 side between cover electrode 12d and cover electrode 13d.

Figure 4I:
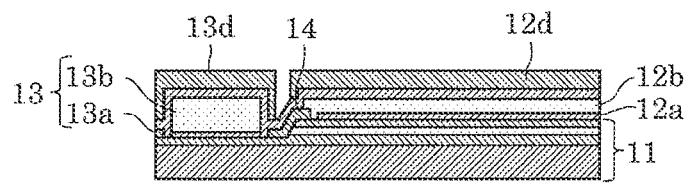
FIG. 4I is a diagram showing a step of removing the resist in the second step of the method for manufacturing the semiconductor device according to Embodiment 1.

Next, as shown in FIG. 4I, resist 15 is removed. For example, resist 15 on seed film 12S is removed with an organic solvent or the like.

[Third Step (Metal Bump Forming Step)]

Next, metal bumps 30 are formed on semiconductor element 10 by the flow shown in FIGS. 5A to 5D. FIGS. 5A to 5D are diagrams showing a flow for forming metal bumps 30 on semiconductor element 10.

Metal bump 30 shown in FIG. 1 includes a p-side first bump corresponding to first p-side electrode 12 and an n-side second bump corresponding to first n-side electrode 13. The first bump is formed on first p-side electrode 12, and the second bump is formed on first n-side electrode 13. In the present embodiment, metal bump 30 is a gold plating bump formed by a gold plating method. In addition, metal bump 30 includes a plurality of metal layers and has a stacked structure in which at least two gold plating films having different crystal grain sizes are stacked. Hereinafter, a method for forming metal bump 30 will be described.

Figure 5A:
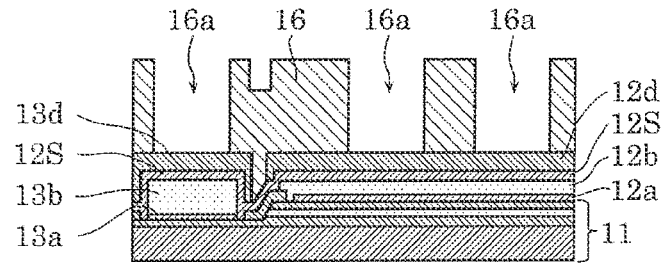
FIG. 5A is a diagram showing a step of forming a resist having openings in the third step of the method for manufacturing the semiconductor device according to Embodiment 1.

After the second step described above, first, a resist for photolithography is applied so as to cover the entire surface of cover electrodes 12d and 13d, and the resist is cured by heat treatment at 140° C. for about 20 minutes. After that, as shown in FIG. 5A, openings 16a having a diameter of 25 µm are formed by photolithography in predetermined regions of resist 16 where metal bumps 30 are formed on each of cover electrode 12d of first p-side electrode 12 and cover electrode 13d of first n-side electrode 13.

Figure 5B:
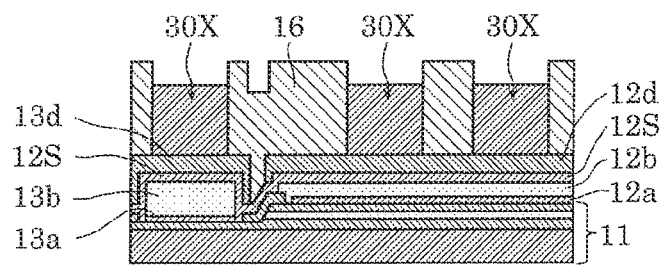
FIG. 5B is a diagram showing a step of forming a gold plating film in the third step of the method for manufacturing the semiconductor device according to Embodiment 1.

Next, as shown in FIG. 5B, gold plating film 30X to be metal bumps 30 is formed by depositing gold in openings 16a of resist 16 with a gold electroplating method. Specifically, gold plating film 30X is simultaneously formed on each of cover electrode 12d of first p-side electrode 12 and cover electrode 13d of first n-side electrode 13 exposed in openings 16a of resist 16. By using a non-cyan type Au plating solution having a plating solution temperature of 50° C. and setting the deposition rate to 0.5 µm/min as an example of conditions for forming gold plating film 30X, gold plating film 30X having a height (thickness) of 5 µm is formed. The crystal structure of gold plating film 30X just after the formation is an aggregate of fine crystal grains as a whole.

Figure 5C:
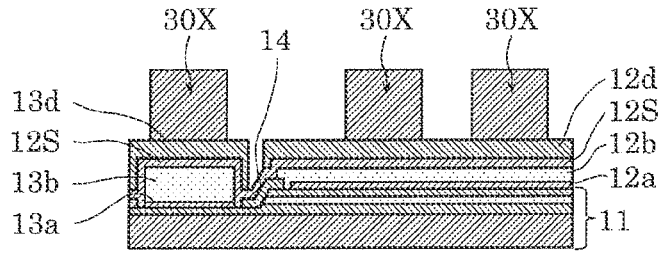
FIG. 5C is a diagram showing a step of removing the resist in the third step of the method for manufacturing the semiconductor device according to Embodiment 1.

Next, as shown in FIG. 5C, resist 16 is removed. For example, resist 16 is removed with an organic solvent or the like. Thereby, cylindrical gold plating film 30X having a diameter of 25 µm and a height of 5 µm is formed in each predetermined region on cover electrode 12d of first p-side electrode 12 and cover electrode 13d of first n-side electrode 13.

Figure 5D:
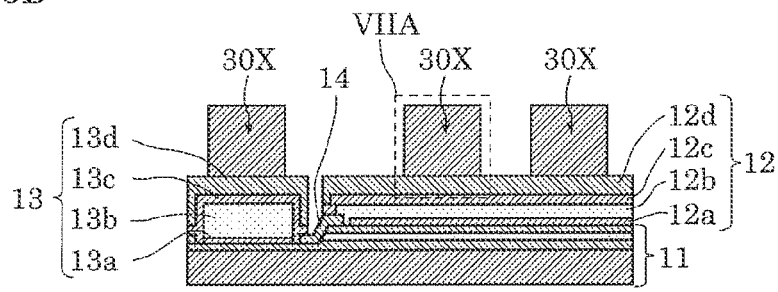
FIG. 5D is a diagram showing a step of removing a part of the seed film and performing p-n separation of the electrode in the third step of the method for manufacturing the semiconductor device according to Embodiment 1.

Next, as shown in FIG. 5D, seed film 12S on oxide film 14 between barrier electrode 12b of first p-side electrode 12 and barrier electrode 13b of first n-side electrode 13 is partially removed. In the present embodiment, since seed film 12S has a stacked structure of an Au layer and a Ti layer, first, the Au layer which is the upper layer of seed film 12S is removed by an iodine solution, and then the Ti layer which is the lower layer of seed film 12S is removed by dilute hydrofluoric acid to expose oxide film 14. Thereby, seed film 12S can be separated into seed layer 12c and seed layer 13c on oxide film 14 to perform the p-n separation of the electrodes. Specifically, first p-side electrode 12 having a stacked structure of reflective electrode 12a, barrier electrode 12b, seed layer 12c, and cover electrode 12d, and first n-side electrode 13 having a stacked structure of ohmic contact layer 13a, barrier electrode 13b, seed layer 13c, and cover electrode 13d can be separated.

Figure 5E:
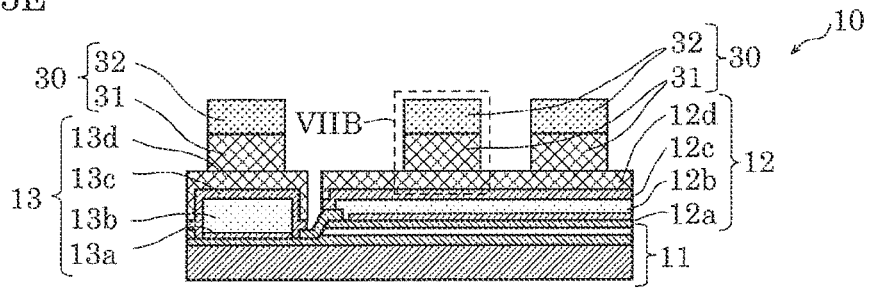
FIG. 5E is a diagram showing a step of performing a heat treatment in the third step of the method for manufacturing the semiconductor device according to Embodiment 1.

Next, as shown in FIG. 5E, the wafer on which gold plating film 30X has been formed is subjected to heat treatment at 150° C. for 1 hour in the air atmosphere. This heat treatment changes the crystal grain sizes of the lower region in gold plating film 30X and cover electrodes 12d and 13d. Thereby, metal bump 30 including two layers of first layer 31 and second layer 32 having the same composition and different crystal grain sizes can be obtained. In metal bump 30, first layer 31 on the side closer to semiconductor stacked structure 11 has a larger crystal grain size than second layer 32 on the side farther from semiconductor stacked structure 11. In addition, the crystal grain size of the crystals included in first layer 31 of metal bump 30 is the same as the crystal grain size of the crystals included in cover electrodes 12d and 13d.

Figure 7A:
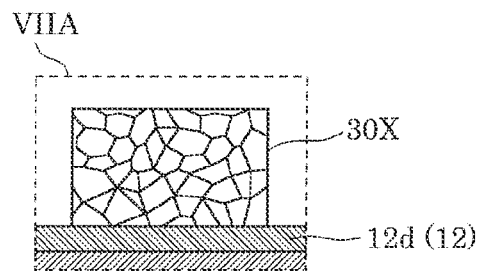
FIG. 7A is an enlarged view of region VIIA in FIG. 5D.
Figure 7B:
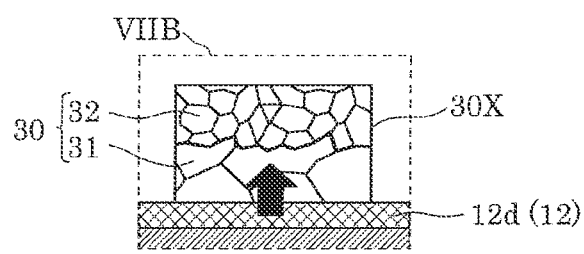
FIG. 7B is an enlarged view of a region VIIB in FIG. 5E.
Figure 7C:
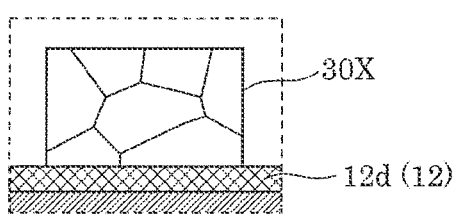
FIG. 7C is a diagram showing a state where crystal grains are further coarsened from the state of FIG. 7B.

Here, the change in crystal grain size due to heat treatment will be described in detail with reference to FIGS. 7A to 7C. FIG. 7A is an enlarged view of region VIIA in FIG. 5D. FIG. 7B is an enlarged view of region VIIB in FIG. 5E. FIG. 7C is a diagram showing a state where the crystal grains are further coarsened from the state of FIG. 7B. FIGS. 7A to 7C show a region corresponding to one gold plating film 30X or metal bump 30 on first p-side electrode 12 and a part of cover electrode 12d of first p-side electrode 12 located therebelow.

FIG. 7A shows a cross section of gold plating film 30X just after gold plating film 30X has been formed. As shown in FIG. 7A, gold plating film 30X just after formation includes an aggregate of fine crystal grains as a whole.

When heat treatment of the wafer on which gold plating film 30X is formed is started in an atmosphere furnace, heat is efficiently transmitted from the first p-side electrode 12 (cover electrode 12d) side to gold plating film 30X in the direction of the arrow, as shown in FIG. 7B. The heat transmitted to gold plating film 30X serves as driving energy for recrystallization of gold included in gold plating film 30X, and the crystal grains on the first p-side electrode 12 side grow large. When the heat treatment is further continued, the crystal grains are coarsened from the first p-side electrode 12 side toward the tip of gold plating film 30X, and finally, the coarsened crystal grains are spread in the entire gold plating film 30X as shown in FIG. 7C. The coarsening of the crystal grains progresses as the temperature of the heat treatment increases or the time of the heat treatment increases.

The heat treatment conditions (heat treatment at 150° C. for 1 hour) when forming metal bumps 30 in the present embodiment are not conditions for coarsening by recrystallization up to the tip of gold plating film 30X as shown in FIG. 7C, but the conditions for stopping the coarsening of crystal grains in the middle of gold plating film 30X as shown in FIG. 7B. That is, gold plating film 30X is subjected to a heat treatment at 150° C. for 1 hour in the air atmosphere to form metal bumps 30 having a substantially two-layer structure when classified by the crystal grain size. Specifically, metal bumps 30 having first layer 31 in which the crystal grains on the side close to first p-side electrode 12 are coarsened and second layer 32 in which the crystal grains are relatively small on the side opposite to first p-side electrode 12 are formed.

It should be noted that for not only gold plating film 30X formed on first p-side electrode 12 but also gold plating film 30X formed on first n-side electrode 13, the crystal grains change similarly to gold plating film 30X formed on first p-side electrode 12. In other words, by the heat treatment at 150° C. for 1 hour, gold plating film 30X formed on first n-side electrode 13 changes into two layers having different crystal grain sizes to form metal bumps 30 having first layer 31 in which the crystal grains on the side close to first n-side electrode 13 are coarsened and second layer 32 in which the crystal grains are relatively small on the side opposite to first n-side electrode 13 as shown in FIG. 7B.

Here, a method for measuring the crystal grain size of gold plating film 30X and metal bump 30 used in the present embodiment will be described below. In the present embodiment, after the cross-section of gold plating film 30X or metal bump 30 was formed using a focused ion beam (Focused Ion Beam: FIB), the intercept method was applied to the observed region where the observation was performed by a Scanning Ion Microscopy image (SIM image) with a scanning microscope to measure the grain size.

Figure 8:
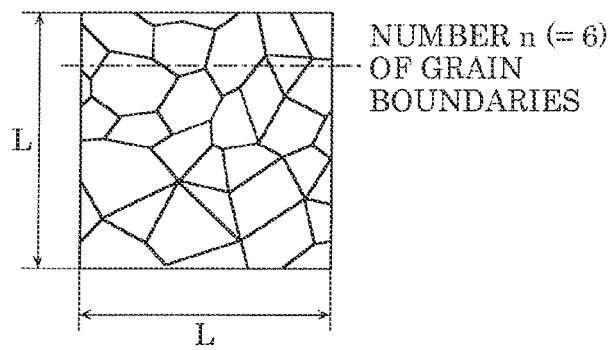
FIG. 8 is a diagram for describing a method for measuring a crystal grain size.

At this time, as shown in FIG. 8, when there are n crystals having an average crystal grain size d in one side in a square having one side L, the area of the square is $L^2$ and the area of one crystal grain is $\Pi(d/2)^2$. When the observation region is relatively large with respect to the crystal grains, the area occupied by all the crystal grains is $n^2 \times \Pi(d/2)^2$ because there are $n^2$ crystal grains in the square, and the area of the square=the area occupied by all the crustal grains, so that $L^2 = n^2 \times \Pi(d/2)^2$. When this is represented by d, it is represented by a relational expression of $d = 2L/n/(\Pi)^{1/2}$. A straight line (alternate long and short dash line in FIG. 8) is drawn in the observation region L×L using this relational expression, and the number of grain boundaries intersecting this straight line is taken as the number n of crystals, and the average crystal grain size d in the horizontal direction and the height direction of gold plating film 30X and metal bump 30 was determined.

Here, the horizontal direction is a direction parallel to the upper surfaces of cover electrodes 12d and 13d, and the height direction is a direction perpendicular to the upper surfaces of cover electrodes 12d and 13d. It should be noted that since the straight line indicated by the alternate long and short dash line intersects with six grain boundaries in FIG. 8, n=6.

In the present embodiment, the cross-section of metal bump 30 having first layer 31 and second layer 32 having different crystal grain sizes is the cross-section shown in FIG. 7B. In this case, when the crystal grain size of metal bump 30 was measured by the method described above, the average crystal grain size in the horizontal direction was 8 μm for first layer 31 and 1 μm for second layer 32. The average crystal grain size in the height direction was 3 μm for first layer 31 and 2 μm for second layer 32.

Figure 9:
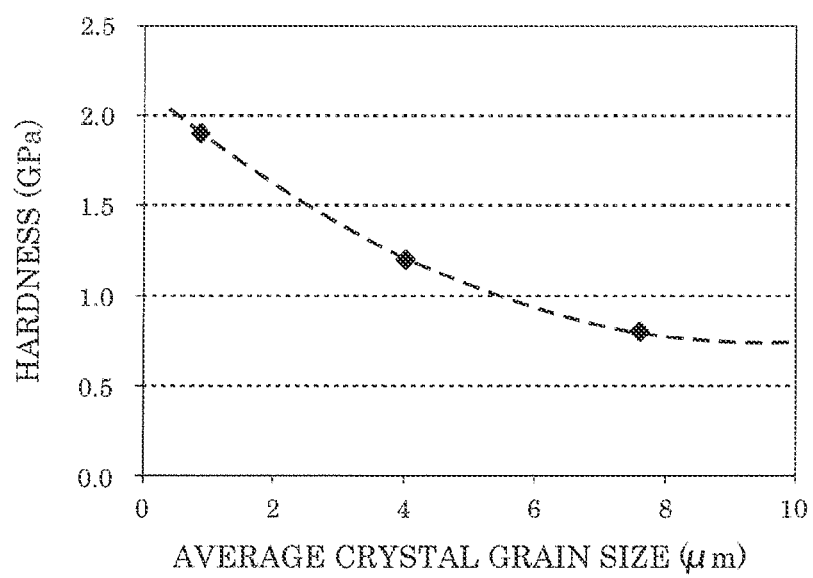
FIG. 9 is a diagram showing a relationship between the average crystal grain size of the gold plating film and the hardness of the single-layer gold plating film.

Here, an experiment was conducted on the relationship between the average crystal grain size of the gold plating film and the hardness of the single-layer gold plating film, so that the results of this experiment will be described with reference to FIG. 9. FIG. 9 is a diagram showing the relationship between the average crystal grain size of the gold plating film and the hardness of the single-layer gold plating film.

In this experiment, a non-cyan type Au plating solution having a plating solution temperature of 50° C. was used, and a deposition rate was set to 0.5 μm/min to produce a single-layer gold plating film having a thickness of 10 μm. The average grain size is controlled by changing the heat treatment conditions for this single layer gold plating film, and the relationship between the average grain size of the gold plating film after the heat treatment and the hardness of the single layer gold plating film before the heat treatment is examined. The average crystal grain size of the gold plating film after the heat treatment was measured using the method for measuring the crystal grain size described above. In this case, the average grain size in the horizontal direction was measured. In addition, for the hardness of the single layer gold plating film before the heat treatment, the hardness measurement using Vickers hardness was performed. It should be noted that in the following description, the average crystal grain size refers to the average crystal grain size in the horizontal direction unless otherwise specified.

As shown in FIG. 9, it can be seen that the average crystal grain size of the gold plating film and the hardness of the single-layer gold plating film have a negative correlation. That is, the hardness increases as the average crystal grain size of the crystals included in the gold plating film decreases. On the contrary, the hardness decreases as the average crystal grain size of the crystals included in the gold plating film increases. In this way, the hardness of the gold plating film decreases as the average crystal grain size of the gold plating film increases, and increases as the average crystal grain size of the gold plating film decreases.

Here, as shown in FIG. 9, when the average crystal grain size of the crystals included in the gold plating film is 8 μm, the hardness of the gold plating film is about 0.8 GPa. That is, the hardness of first layer 31 having an average crystal grain size of 8 μm is about 0.8 GPa in metal bump 30 formed under the heat treatment conditions described above.

In addition, when the average crystal grain size of the crystals included in the gold plating film is 1 μm, the hardness of the gold plating film is about 1.9 GPa. That is, the hardness of second layer 32 having an average crystal grain size of 1 μm is about 1.9 GPa in metal bump 30 formed under the heat treatment conditions described above.

In this way, comparing the average crystal grain sizes, the film having the larger crystal grain size is a soft layer, and the film having the smaller crystal grain size is a hard layer. That is, the gold plating film (first layer 31) having an average crystal grain size of 8 μm is a softer film than the gold plating film (second layer 32) having an average crystal grain size of 1 μm.

[Fourth Step (Step of Mounting Semiconductor Element on Mounting Board)]

Figure 6A:
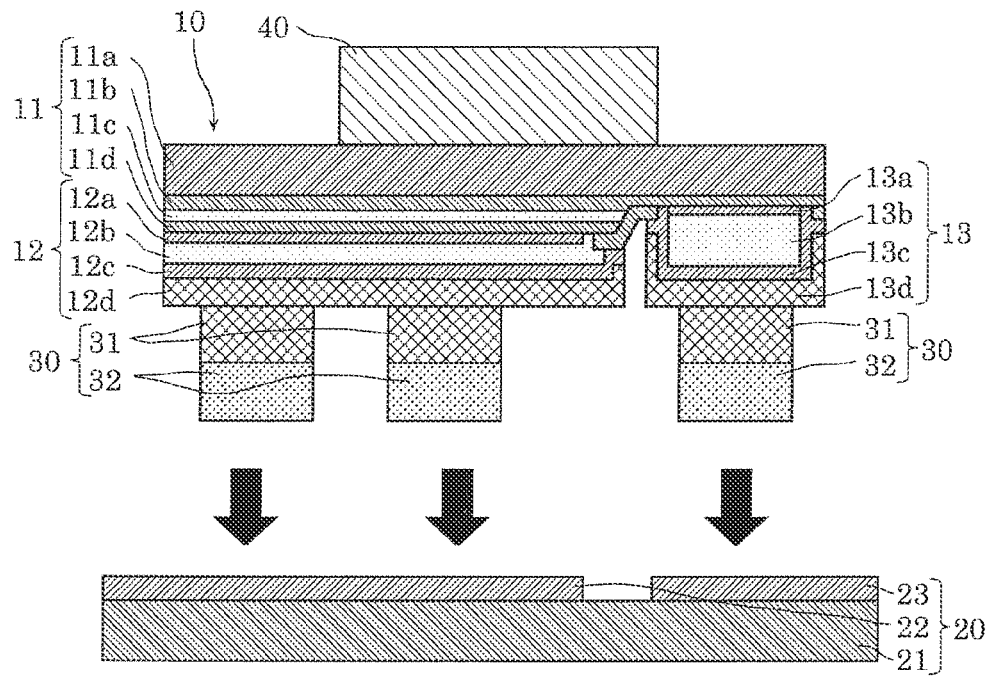
FIG. 6A is a diagram showing a step of disposing a semiconductor element on a mounting board in the fourth step of the method for manufacturing a semiconductor device according to Embodiment 1.
Figure 6B:
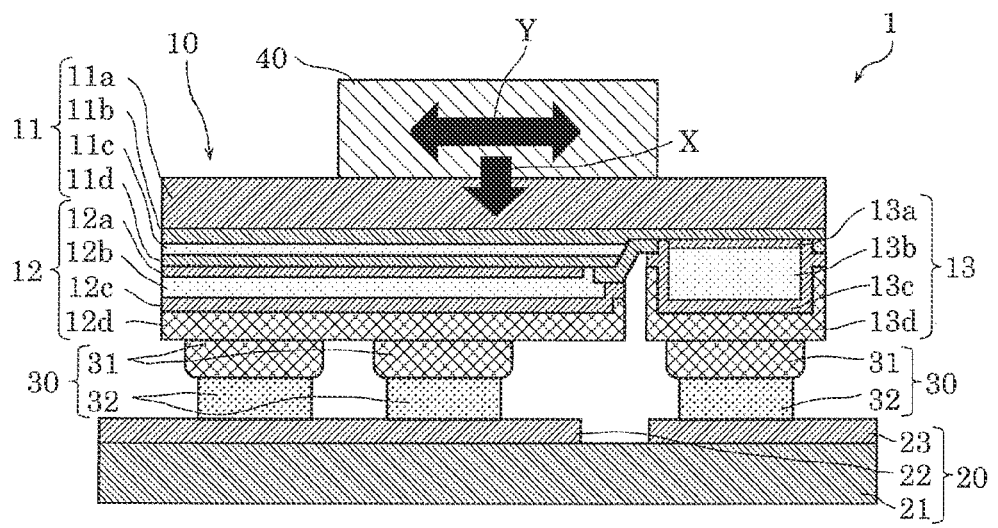
FIG. 6B is a diagram showing a step of mounting a semiconductor element on a mounting board and performing ultrasonic bonding in the fourth step of the method for manufacturing a semiconductor device according to Embodiment 1.

Next, according to the flow shown in FIGS. 6A and 6B, semiconductor element 10 is mounted on mounting board 20 via metal bumps 30 by flip chip bonding. FIGS. 6A and 6B are diagrams showing a flow of mounting semiconductor element 10 on mounting board 20 via metal bumps 30.

First, mounting board 20 for mounting semiconductor element 10 is prepared. Specifically, substrate 21 on which second p-side electrode 22 and second n-side electrode 23 were formed was prepared as mounting board 20. In the present embodiment, substrate 21 is a ceramic substrate comprising a sintered body of AlN. In addition, second p-side electrode 22 and second n-side electrode 23 are gold plating films and were formed by using a non-cyan type Au plating solution. It should be noted that although not shown, a seed layer separated by second p-side electrode 22 and second n-side electrode 23 may be formed between each of second p-side electrode 22 and second n-side electrode 23 and substrate 21.

Then, as shown in FIG. 6A, semiconductor element 10 on which metal bumps 30 are formed in advance is prepared, and semiconductor element 10 is vacuum-adsorbed to holding metal tube 40 of the mounting machine so that the metal bump 30 side faces mounting board 20. It should be noted that semiconductor element 10 having a size of 800 μm square×100 μm thick is used in the present embodiment.

Next, as shown in FIG. 6B, metal bumps 30 of semiconductor element 10 and the second electrodes (second p-side electrode 22, second n-side electrode 23) of mounting board 20 are heated to about 200° C. while they are in contact with each other, and while a load of 30 N is applied to mounting board 20 in the vertical direction (the direction of arrow X in the drawing: first direction) by holding metal tube 40, ultrasonic vibration is applied in the horizontal direction (the direction of arrow Y in the drawing: second direction) relative to mounting board 20 for 200 ms. Thereby, metal bumps 30 and the second electrodes (second p-side electrode 22, second n-side electrode 23) of mounting board 20 was ultrasonically bonded.

Here, a change that occurs in metal bump 30 when metal bump 30 and the second electrodes of mounting board 20 are bonded by ultrasonic bonding will be described in detail with reference to FIGS. 10 and 11A to 11D.

FIG. 10 is a timing chart of ultrasonic bonding when semiconductor element 10 is mounted on mounting board 20 in Embodiment 1. In FIG. 10, the horizontal axis represents time and the vertical axis represents load. It should be noted that 0 ms is before (or at the start of) the processing, 300 ms corresponds to a processing time of the ultrasonic bonding in the present embodiment, and 400 ms corresponds to a processing time obtained by extending the ultrasonic wave application time to the processing time of the ultrasonic bonding in the present embodiment by 100 ms.

As shown in FIG. 10, the load is gradually increased during 100 ms (Step 1) after the bonding process between semiconductor element 10 and mounting board 20 is started. In this Step 1, only the load is applied without applying an ultrasonic wave. In addition, during 100 ms to 400 ms (Step 2), the ultrasonic wave is applied while keeping the load constant. By performing the bonding process shown in such a timing chart, semiconductor element 10 and mounting board 20 are ultrasonically bonded via metal bumps 30.

In this case, a cross-section of the bonding portion between semiconductor element 10 and mounting board 20 at each time of 0 ms, 100 ms, 300 ms, and 400 ms after starting the bonding process between semiconductor element 10 and mounting board 20, specifically, a cross-section of the bonding portion between metal bump 30 and the second electrodes of mounting board 20 is shown in FIGS. 11A to 11D, respectively. It should be noted that in FIGS. 11A to 11D, only the bonding portion on second p-side electrode 22 of the second electrodes of mounting board 20 is shown, but the same applies to the bonding portion on second n-side electrode 23.

Figure 11A:
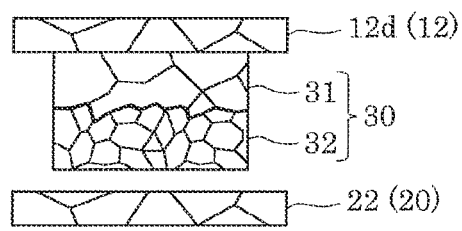
FIG. 11A is a diagram showing a cross-section around a metal bump before the ultrasonic bonding is performed in Embodiment 1.

FIG. 11A shows a cross-section around metal bump 30 before performing the ultrasonic bonding according to the present embodiment. As shown in FIG. 11A, the crystal grains of gold (Au) included in first layer 31 and second layer 32 of metal bump 30 maintain substantially the same grain size in each layer, and metal bump 30 as a whole has a cylindrical shape with the same diameter.

Figure 11B:
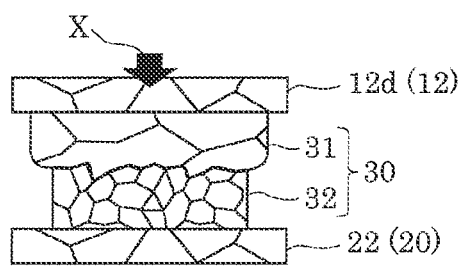
FIG. 11B is a diagram showing a bonding state between the metal bump and the second electrodes of the mounting board just after Step 1 in FIG. 10.

FIG. 11B shows a bonding state of metal bump 30 and the second electrodes of mounting board 20 just after Step 1 in FIG. 10. Specifically, FIG. 11B shows a state after only the load is applied to mounting board 20 in the vertical direction (the direction of arrow X in the drawing). In Step 1, as the load is applied, first layer 31 that is relatively softer than second layer 32 is deformed. As a result, the shape of first layer 31 spreads laterally and becomes a wide top shape. At this time, second layer 32, which is relatively harder than first layer 31, is not crushed and substantially maintains the shape before the start of processing. In addition, the shapes of the second electrodes (second p-side electrode 22 and second n-side electrode 23) of mounting board 20 also maintain the shapes before the start of processing.

Figure 11C:
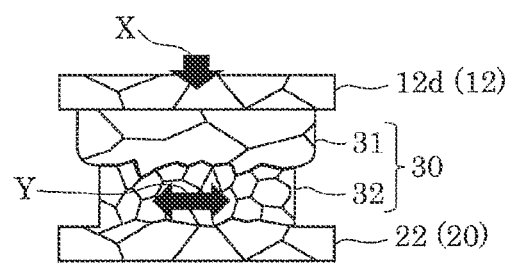
FIG. 11C is a diagram showing a bonding state between the metal bump and the second electrodes of the mounting board in the middle point of Step 2 (about 300 ms after the process start) in FIG. 10.

FIG. 11C shows a bonding state of metal bump 30 and the second electrodes of mounting board 20 in the middle point of Step 2 (about 300 ms after the start of processing and 200 ms after the start of ultrasonic vibration) in FIG. 10. Specifically, FIG. 11C shows a state in which a constant load of 30 N is applied to mounting board 20 in the vertical direction (the direction of arrow X in the drawing), and an ultrasonic wave is applied to apply ultrasonic vibration to mounting board 20 in the horizontal direction (the direction of arrow Y in the drawing) to bond semiconductor element 10 and the second electrodes of mounting board 20.

In this way, by applying the ultrasonic wave, metal bumps 30 vibrate in the horizontal direction with respect to mounting board 20, the interface where second layer 32 of metal bumps 30 and the second electrodes of mounting board 20 contact with each other is heated by friction, and metal bump 30 and the second electrodes of mounting board 20 are solid-phase bonded and integrated with each other. At this time, some of the Au crystal grains of the surface layer of the second electrodes of mounting board 20 and the Au crystal grains of second layer 32 of metal bump 30 are integrated without maintaining the original shape, and the boundary between second layer 32 of metal bump 30 and the second electrodes of mounting board 20 is no longer a clear boundary.

Figure 11D:
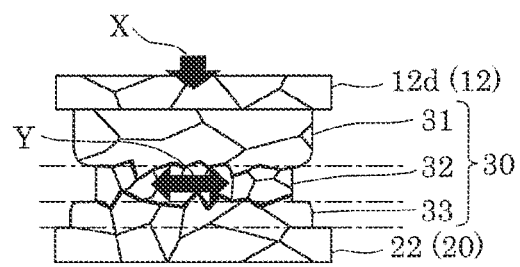
FIG. 11D is a diagram showing a bonding state between the metal bump and the second electrodes of the mounting board at the end of Step 2 in FIG. 10.

FIG. 11D shows a bonding state between metal bump 30 and the second electrodes of mounting board 20 at the end point of Step 2 (about 400 ms after the start of processing and 300 ms after the start of ultrasonic vibration) in FIG. 10.

In the bonding state of FIG. 11D, the Au crystal grains derived from second layer 32 and the Au crystal grains derived from the second electrodes are integrated at the bonding interface between second layer 32 of metal bump 30 and the second electrodes of mounting board 20. Then, third layer 33 is formed as a layer in which the Au crystal grains are integrated with each other and the Au crystal grains are coarsened. Since this third layer 33 is formed by coarsening Au crystal grains, it is soft as a layer. In addition, since third layer 33 is formed by applying ultrasonic vibration to mounting board 20 in the horizontal direction (the direction of arrow Y in the drawing), third layer 33 spreads laterally more than second layer 32.

In the present embodiment, the condition that an ultrasonic wave shown in FIG. 11C is applied for up to 200 ms is applied to the ultrasonic bonding between semiconductor element 10 and mounting board 20. The cross-section passing through the center of metal bump 30 in this case is the cross-section shown in FIG. 2 described above.

As a result, as shown in FIG. 2, metal bump 30 having first layer 31 and second layer 32 is formed into a wide top shape that spreads toward the first layer 31 side.

In the present embodiment, the thickness (height) of first layer 31 that was relatively soft in metal bump 30 was 2 μm before bonding and 1 μm after bonding, and became 1 μm thinner before and after bonding. In contrast, the thickness of relatively hard second layer 32 in metal bump 30 was 3 μm in unchanged before and after bonding. In this way, since the thickness of first layer 31 having a large crystal grain size and softness remains 1 μm even after the bonding, the corners of the crystals which are inside second layer 32 do not reach cover electrodes 12d and 13d of the first electrodes. It is considered that this alleviates the impact when semiconductor element 10 is mounted on mounting board 20.

In addition, regarding the width of metal bump 30, width W1 at the bonding interface between the first electrodes and first layer 31 was 30 μm, and width W2 of second layer 32 was 25 μm. That is, metal bump 30 after the ultrasonic bonding has a wide top shape in which width W1 of the bonding interface on the first electrode side is wider than width W2 of second layer 32.

Here, as shown by the alternate long and short dash line in FIG. 2, when virtual bump 30R having a virtual rectangle cross-section having a same area and a same height as a cross-sectional shape of metal bump 30 is virtually defined in the cross-section of semiconductor element 10, mounting board 20, and metal bumps 30 in the direction perpendicular to mounting board 20, length L of the bottom of the rectangle of virtual bump 30R is 25.6 μm. Comparing this virtual bump 30R with metal bump 30 in the present embodiment, width W1 of the first bonding portion which is a bonding portion (bonding interface) between the first electrodes of semiconductor element 10 and first layer 31 of metal bump 30 is longer than length L of the bottom of virtual bump 30R. Therefore, metal bump 30 can be expected to have higher bonding strength than virtual bump 30R having the same cross-sectional area. It should be noted that second layer 32 of metal bump 30 has a width shorter than length L of the bottom of the rectangle of virtual bump 30R.

Figure 12:
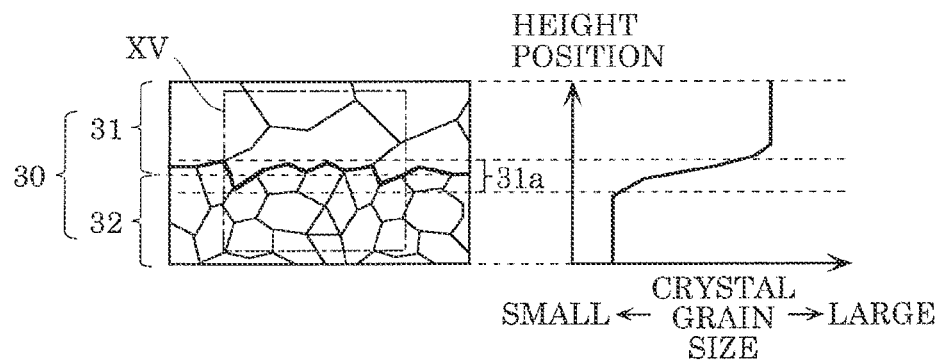
FIG. 12 is a diagram showing a distribution of crystal grain sizes of the metal bump in the semiconductor device according to Embodiment 1.

Here, when the crystal grain size distribution in the horizontal direction in metal bump 30 after ultrasonic bonding was confirmed in detail, it has been found that the average crystal grain size of the crystals included in first layer 31 gradually decreases as the distance from the first electrodes (first p-side electrode 12, first n-side electrode 13) on the first layer 31 side increases as shown in FIG. 12. That is, first layer 31 has, on the side of second layer 32, transition region 31a in which an average crystal grain size approaches from the average crystal grain size of the first layer to the average crystal grain size of the second layer. This transition region is a region in first layer 31 that is in contact with second layer 32, and is a layer having an intermediate hardness between first layer 31 and second layer 32.

When such a transition region is present in metal bump 30, since the transition region has an amount of deformation which is intermediate between first layer 31 and second layer 32, the transition region further suppresses direct damage to the first electrodes, as compared with metal bump 30 having a structure in which the crystal grains sharply decrease from first layer 31 to second layer 32 as shown in FIG. 2. This leads to suppression of peeling between layers when semiconductor element 10 receives an impact during mounting. That is, the transition region acts to alleviate a larger impact.

[Verification of Effect]

Next, the effect of semiconductor device 1 according to Embodiment 1 has been verified, so that the verification result will be described below in comparison with semiconductor device 100 of the comparative example. Semiconductor device 100 of the comparative example has the same configuration as the semiconductor device shown in FIG. 29B, and the hardness of metal bumps 130 is high.

In semiconductor device 100 of the comparative example, after gold plating film 30X was formed, the heat treatment for coarsening the crystal grains of gold plating film 30X was not performed, and gold plating film 30X was used as it was as metal bump 130 in the method of manufacturing semiconductor device 1 according to the present embodiment. Here, metal bump 130 having a thickness of 5 μm and a diameter of 25 μm was formed. In this way, in semiconductor device 100 of the comparative example, since the heat treatment was not performed after gold plating film 30X was formed, the crystal grain size of metal bump 130 was small and the average crystal grain size in the horizontal direction was 0.8 μm. In addition, the hardness of metal bump 130 was about 1.9 GPa.

Figure 13:
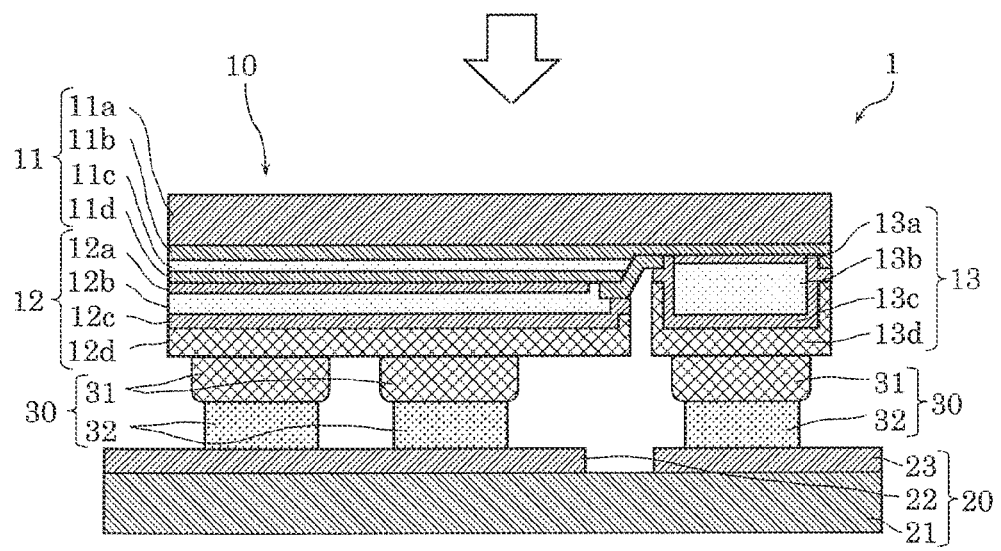
FIG. 13 is a diagram for describing a method for observing an electrode surface of the semiconductor device.

Then, semiconductor device 100 of the comparative example was mounted on mounting board 20 by flip-chip bonding in the same manner as semiconductor device 1 of Embodiment 1, and semiconductor device 100 of the comparative example and semiconductor device 1 according to Embodiment 1 were compared with each other for the damage received by first p-side electrode 12 due to the impact at the time of mounting. The damage received by each semiconductor device was evaluated by optically observing the electrode surface of first p-side electrode 12 through substrate 11a after mounting, as shown in FIG. 13. The evaluation results are shown below.

In semiconductor device 100 of the comparative example, portions where the contrast changed were confirmed at the positions where metal bumps 130 were projected on the electrode surface of first p-side electrode 12. It is considered that this was observed as a change in contrast because when metal bumps 130 were pressed, local pressure was applied to first p-side electrode 12, and reflective electrode 12a was deformed and partially thinned, so that the reflectance was reduced. This phenomenon was also confirmed as a similar deformation in ohmic contact layer 13a of first n-side electrode 13. The portions where the contrast changed in this way were called bump marks and were used as an index of damage occurrence.

On the other hand, when the same test was performed on semiconductor device 1 according to Embodiment 1, no bump marks were observed in semiconductor device 1 according to Embodiment 1. This is considered to be due to the following reasons.

Metal bump 30 of semiconductor device 1 according to Embodiment 1 has first layer 31 which has a large crystal grain size and is soft, and second layer 32 which has a small crystal grain size and is hard. Thereby, it is considered that soft first layer 31 absorbed the impact of the load application at the time of mounting, deformed at the time of mounting, and acted as a cushioning material against the impact, so that no bump marks were generated. In this case, it is considered that hard second layer 32 penetrates soft first layer 31 due to the load application during mounting. However, since first layer 31 has a thickness of 1 μm in the present embodiment, it is considered that second layer 32 did not penetrate first layer 31. In fact, it has been found that first layer 31 exists between second layer 32 and first p-side electrode 12 at any position in the cross-section.

In addition, since first p-side electrode 12 is formed on the region where p-type semiconductor layer 11d, active layer 11c, and n-type semiconductor layer 11b are stacked in semiconductor device 1 according to Embodiment 1, semiconductor device 1 has a structure in which an electrical defect such as a p-n short-circuit defect is likely to occur due to damage to the first p-side electrode 12 due to impact during mounting, but such an electrical defect did not occur.

Next, the bonding strength of metal bumps 30 of semiconductor device 1 according to Embodiment 1 will be described below. In this case, the strength of the bonding portion between metal bump 30 and mounting board 20 was measured and evaluated by shear strength. Here, a method for measuring the shear strength will be described with reference to FIGS. 14A and 14B.

Figure 14A:
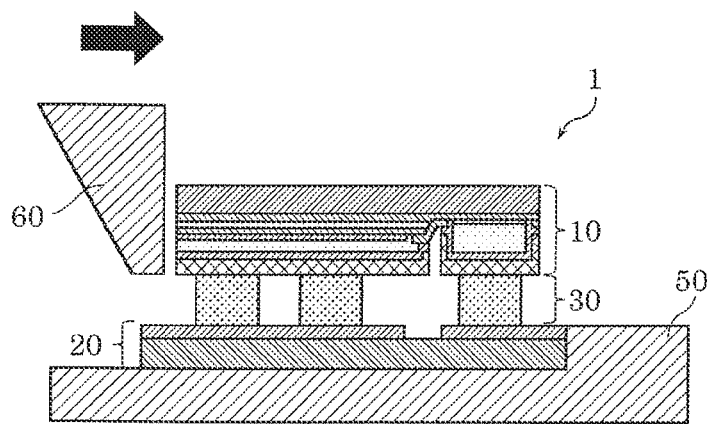
FIG. 14A is a diagram showing a state before a load is applied by a shear sensor in a method for measuring a shear strength of the semiconductor device.
Figure 14B:
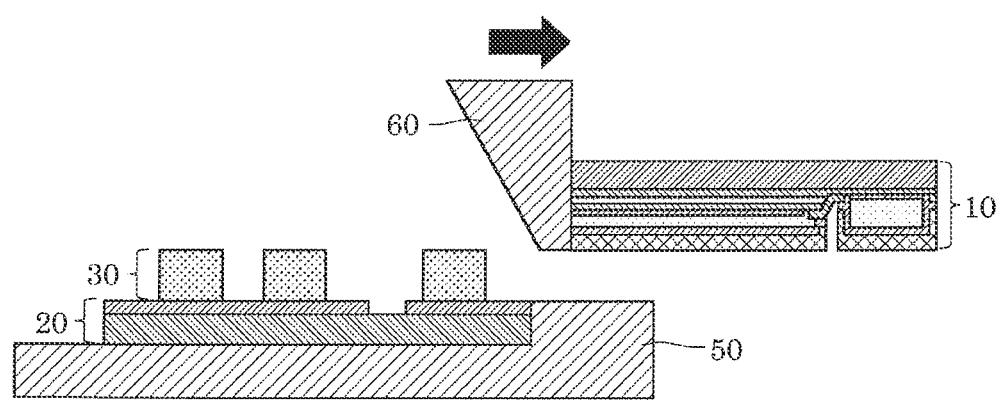
FIG. 14B is a diagram showing a state after a load is applied by a shear sensor in a method for measuring a shear strength of the semiconductor device.

First, as shown in FIG. 14A, semiconductor device 1 is fixed to metal stage 50, and shear sensor 60 is pressed against semiconductor element 10 from the side of semiconductor element 10. Next, as shown in FIG. 14B, shear sensor 60 is slid laterally and a load is applied until semiconductor element 10 comes off mounting board 20. At this time, the maximum load until semiconductor element 10 comes off is defined as the shear strength.

As a result, the shear strength of semiconductor device 100 of the comparative example was 5 kgF. On the other hand, the shear strength of semiconductor device 1 according to Embodiment 1 was 8 kgF.

In addition, it is considered that the reason why semiconductor device 1 according to Embodiment 1 has a higher shear strength than semiconductor device 100 of the comparative example is that the cross-sectional shape of metal bump 30 of semiconductor device 1 according to Embodiment 1 is a wide top shape, and the bonding area between (i) first p-side electrode 12 and first n-side electrode 13 and (ii) metal bump 30 is increased.

Specifically, width W1 of the bonding interface between (i) first p-side electrode 12 and first n-side electrode 13 and (ii) metal bump 130 on semiconductor device 100 of the comparative example shown in FIG. 29B was 25 μm, whereas width W1 (see FIG. 2) of the bonding interface between (i) first p-side electrode 12 and first n-side electrode 13 and (ii) metal bump 30 on semiconductor device 1 according to Embodiment 1 shown in FIG. 1 was 30 μm. In this way, it is considered that since the area of bonding portion between metal bump 30 and mounting board 20 was in an increased wide top shape in semiconductor device 1 according to Embodiment 1, the shear strength was also increased from 5 kgF to 8 kgF, as width W1 of the bonding interface between (i) first p-side electrode 12 and first n-side electrode 13 and (ii) metal bumps 130 was increased.

Metal bump 30 of semiconductor device 1 according to Embodiment 1 has such a shape characteristic that width W1 of the bonding interface between the first electrodes (first p-side electrode 12, first n-side electrode 13) and metal bump 30 is larger than length L of the bottom of virtual bump 30R having the same cross-sectional area as metal bump 30 as shown in FIG. 2, and it is considered that the shape characteristic is important for improving the shear strength.

Figure 15:
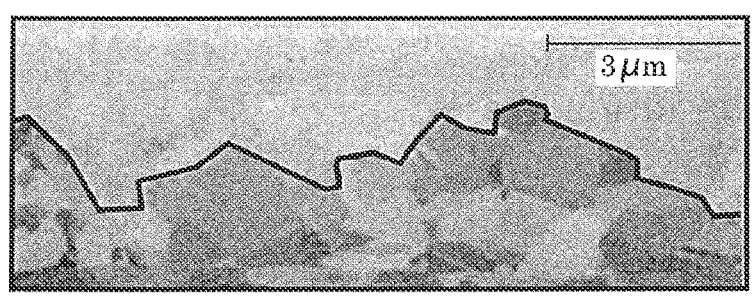
FIG. 15 is a SIM image of a portion corresponding to a region XV surrounded by the alternate long and short dash line in FIG. 12.

Here, the result of observing the state of the Au crystal grains of metal bump 30 of semiconductor device 1 according to Embodiment 1 with the SIM image of the scanning microscope will be described with reference to FIG. 15. FIG. 15 is a SIM image of a portion corresponding to the region XV surrounded by the alternate long and short dash line in FIG. 12.

The observation of the SIM image was performed by using the one in which the cross-section of metal bump 30 was formed using FIB. In this method, the difference in crystal orientation of the metal structure can be observed as the difference in contrast.

As shown in FIG. 15, it can be seen that it is divided into a layer observed with a single contrast and a layer observed with an aggregate of a plurality of contrasts.

Specifically, the portion corresponding to first layer 31 located on the semiconductor stacked structure 11 side showed a single contrast and had an equiaxed crystal grain structure with uniform alignment. In this portion, the crystal grains are coarsened by the heat treatment after the gold plating film is formed and abnormal grain growth occurs, so that the crystal grain boundary is extremely reduced. For this reason, it is a soft layer that is easily plastically deformed.

On the other hand, the portion corresponding to second layer 32 located on the mounting board 20 side was an aggregate of a plurality of contrasts, and was a collective structure of crystal grains whose crystal axes were not aligned. That is, the portion corresponding to second layer 32 has a multiaxial crystal grain structure. In this portion, abnormal grain growth did not occur even after the heat treatment after forming the gold plating film, so that there are many grain boundaries. For this reason, the grain boundary acts as a resistance against stress and is a hard layer that is unlikely to undergo plastic deformation.

It is considered that the presence of first layer 31 having the equiaxed crystal grain structure between (i) second layer 32 having the multiaxial crystal grain structure and (ii) first p-side electrode 12 and first n-side electrode 13 makes first layer 31 act as an impact alleviation layer based on plastic deformation, and thus it can be expected to suppress the generation of bump marks.

Furthermore, as shown in FIG. 15, the interface between first layer 31 and second layer 32 inside metal bump 30 has an irregular shape, and is an irregular interface. Due to this irregular shape, the area of the interface between first layer 31 and second layer 32 increases, and the adhesion between the layers increases.

In addition, as described above, first layer 31 may have a transition region in which the average crystal grain size changes toward the second layer 32 side in semiconductor device 1 according to Embodiment 1. This transition region differs depending on the size of the irregularities at the interface between first layer 31 and second layer 32. That is, if the interface between first layer 31 and second layer 32 is not irregular, the transition region does not exist in first layer 31, and the larger the irregularities at the interface between first layer 31 and second layer 32, the larger the transition region. Here, a plurality of semiconductor devices having different transition region thicknesses were manufactured and the shear strength of each was measured. In this case, when the sum of the height of the peak having the highest irregularities and the depth of the valley having the deepest irregularities at the interface between first layer 31 and second layer 32 in the transition region is defined as the maximum height roughness Rz, when the heights of metal bumps 30 were the same, the semiconductor device having a larger maximum height roughness Rz had a higher shear strength. In particular, the shear strength was high when the maximum height roughness Rz at the interface between first layer 31 and second layer 32 was larger than the average crystal grain size of second layer 32.

It should be noted that if the average crystal grain size of first layer 31 is equal to or greater than the maximum height roughness Rz of the interface between first layer 31 and second layer 32, hard second layer 32 does not penetrate first layer 31 by impact during mounting 32 to damage the first electrodes (first p-side electrode 12, first n-side electrode 13), and the effect of the cushioning material against impact during mounting is more significantly exhibited.

In addition, a high temperature and high humidity current test was performed on semiconductor device 1 according to Embodiment 1 having no bump marks and semiconductor device 100 of the comparative example having bump marks. Specifically, 15 samples of each of semiconductor device 1 and semiconductor device 100 were prepared, and a current test was performed for 1000 hours under the conditions of an environmental temperature of 85° C., energizing current of 0.35 A, humidity of 85%, and Tj=150° C.

As a result, the number of defective occurrences of semiconductor device 100 of the comparative example was 5/15, whereas the number of defective occurrences of semiconductor device 1 according to Embodiment 1 was 0/15. That is, no defect occurred in semiconductor device 1 according to Embodiment 1.

In semiconductor device 100 of the comparative example in which the defect occurred, a short-circuit defect was confirmed as the cause of the defect. When a defective product of semiconductor device 100 of this comparative example was analyzed, the bump mark generation portion was identified as a short-circuit generation portion. When the cross-section of this short-circuit generation portion was analyzed, a crack reaching the surface of semiconductor stacked structure 11 was generated in the bump mark generation portion of first p-side electrode 12. It is considered that the short-circuit defect is caused by the p-n junction short-circuit caused by the intrusion of water from the cracks of first p-side electrode 12 when the high temperature and high humidity is applied to corrode the semiconductor layer of semiconductor stacked structure 11.

On the other hand, in semiconductor device 1 according to Embodiment 1, since the soft first layer 31 exists in metal bump 30, the impact on the first electrodes at the time of mounting is alleviated as described above and the occurrence of the bump marks can be suppressed. Furthermore, since soft first layer 31 spreads over the surface of the first electrodes to increase the area of the bonding portion between the first electrodes and metal bump 30, the bonding strength is increased. Moreover, the larger the maximum height roughness Rz of the interface between first layer 31 and second layer 32 is, the larger the area of the interface is, and the adhesion between first layer 31 and second layer 32 is improved. In this case, if the crystal grain size of first layer 31 is larger than the maximum height roughness Rz, the effect of the cushioning material on the impact during mounting becomes more remarkable.

Furthermore, the inventors of the present application have studied the conditions under which bump marks do not occur during mounting, so that the results of the study will be described below. The inventors of the present application have made repeated studies and investigated the relationship between the parameters of each layer when mounting by flip-chip bonding, and found conditions under which bump marks do not occur.

Specifically, as shown in FIGS. 6A and 6B, metal bump 30 and the second electrodes of mounting board 20 were ultrasonically bonded by heating while metal bumps 30 formed on semiconductor element 10 and the second electrodes (second p-side electrode 22, second n-side electrode 23) of mounting board 20 are in contact with each other and applying ultrasonic vibration while a load is applied by holding metal tube 40. The conditions for the occurrence of bump marks in this case will be described below.

In limiting the conditions under which bump marks do not occur, the thickness A of cover electrode 12$d$ (the surface layer of the first electrodes), the average crystal grain size B of cover electrode 12$d$, the thickness C of first layer 31 on the semiconductor element 10 side, and the maximum height roughness Rz of the interface between first layer 31 and second layer 32 are defined as parameters of each layer of interest, the condition under which no bump marks occur was in the range represented by the following (Formula 1).

$$C > Rz/2 + 1 - A*B/8 \qquad \text{(Formula 1)}$$

This is explained by the following mechanism.

Figure 16:
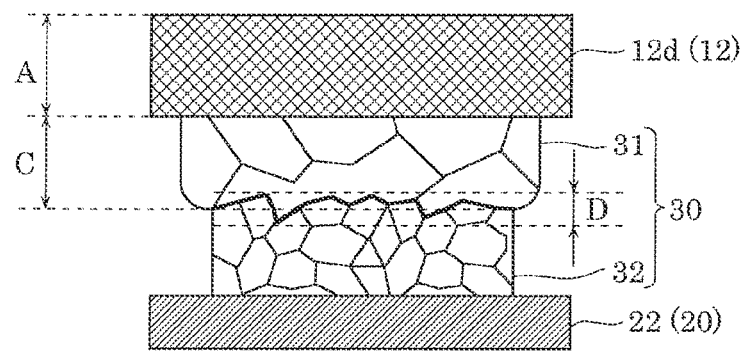
FIG. 16 is an enlarged cross-sectional view of a region XVI surrounded by the alternate long and short dash line in FIG. 1.

FIG. 16 is an enlarged cross-sectional view of the region XVI surrounded by the alternate long and short dash line in FIG. 1.

In FIG. 16, the layer that plays the role of a cushioning material that prevents bump marks is two layers of cover electrode 12$d$ and first layer 31.

If the value obtained by subtracting the thickness D (=Rz/2) of the interface irregularities between first layer 31 and second layer 32 from the total thickness (A+C) of the two layers is larger than 1 μm, it is shown that the deformation of the first electrodes do not occur, because the tips of the hard interface irregularities of the crystal grains of second layer 32 do not penetrate first layer 31 that functions as a cushioning material and do not contact reflective electrode 12a and barrier electrode 12b. That is, the condition is that no bump marks are generated. This condition is represented by the following (Formula 2).

$$A*\alpha+C-Rz/2>1 \quad \text{(Formula 2)}$$

Here, the variable α is a function of the crystal grain size C of cover electrode 12d associated with the hardness of cover electrode 12d, and is represented by the following (Formula 3) using the constant k.

$$\alpha=B*k \quad \text{(Formula 3)}$$

By transforming (Formula 2) using this (Formula 3), the following (Formula 4) is obtained.

$$C>Rz/2+1-A*B*k \quad \text{(Formula 4)}$$

Here, in order to obtain k, the condition that the bump marks are confirmed as the boundary condition is substituted into the following (Formula 5) as the following condition (I).

Condition (I): Rz=2 μm, A=1 μm, B=8 μm, C=1 μm $$C=Rz/2+1-A*B*k \quad \text{(Formula 5)}$$

As a result, the following (Formula 6) is obtained.

$$1=2/2+1-1*8*k \quad \text{(Formula 6)}$$

By solving (Formula 6), k=1/8.

Therefore, the condition for confirming the bump marks, that is, the boundary condition for generating the bump marks is represented by the following (Formula 7).

$$C=Rz/2+1-A*B/8 \quad \text{(Formula 7)}$$

Therefore, the condition that the bump marks are not generated is represented by the above (formula 1).

Here, in order to illustrate the case of B=8 μm and Rz=2 μm of the condition (I), substituting them into (Formula 1) gives the following (Formula 8).

$$C>2/2+1-A*8/8 \quad \text{(Formula 8)}$$

When this (Formula 8) is organized, the following (Formula 9) is obtained.

$$C>2-A \quad \text{(Formula 9)}$$

Figure 17:
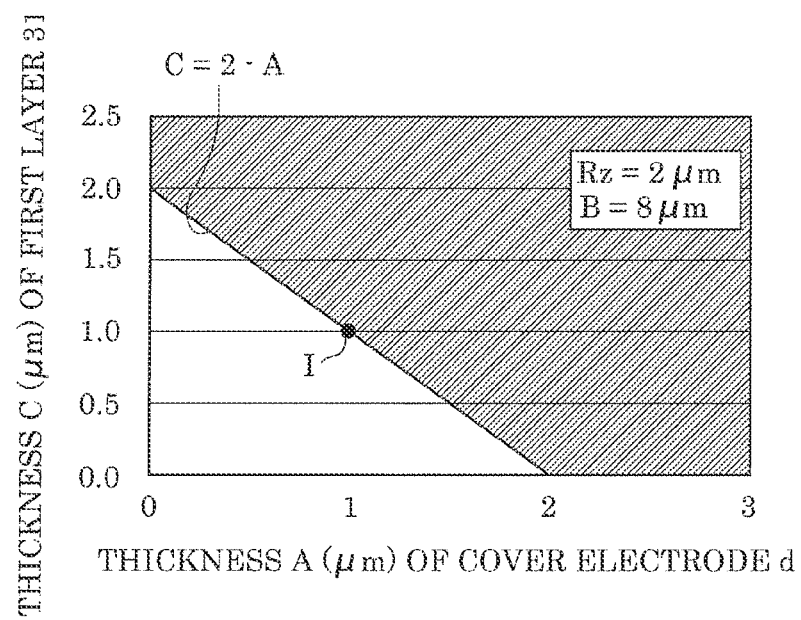
FIG. 17 is a diagram showing a region where no bump marks are generated on the first electrodes when the semiconductor element is mounted on the mounting board.

The relational expression of this (Formula 9) is illustrated in FIG. 17. In FIG. 17, a hatched portion indicates a region where no bump marks are generated.

In this way, the study by the inventors of the present application has made it possible to clarify the region where the bump marks that cause the reliability failure is not generated. Thereby, it is possible to perform a process design in consideration of variations in each parameter when semiconductor device 1 is mass-produced, and it is possible to raise the mechanical reliability level of semiconductor device 1.

As described above, according to semiconductor device 1 according to the present embodiment, when semiconductor element 10 is mounted on mounting board 20 by flip chip bonding in such a case that a plating bump technique having a high degree of design freedom with respect to thickness and bonding area is applied or the like, it is possible to reduce damage to semiconductor element 10 and to avoid a short-circuit defect caused by bump marks generated on the first electrodes of semiconductor element 10. Moreover, the adhesion and the bonding strength between semiconductor element 10 and mounting board 20 can be improved. Thereby, it is possible to suppress the occurrence of defects due to the bonding of the metal bumps, such as damage or peeling of the first electrodes and the second electrodes when semiconductor element 10 is mounted on mounting board 20, and mechanical reliability level can be raised. Therefore, semiconductor device 1 having excellent long-term reliability can be obtained.

It should be noted that semiconductor device 1 having such excellent long-term reliability is suitable as a light source for vehicle-mounted application, which is downsized, has an increased current, and is integrated.

Embodiment 2

Figure 18:
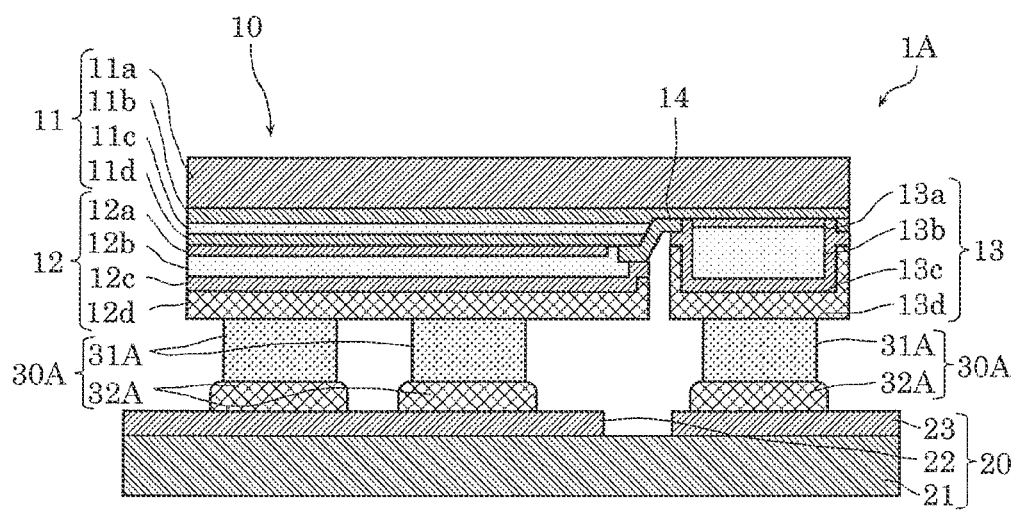
FIG. 18 is a cross-sectional view of the semiconductor device according to Embodiment 2.
Figure 19:
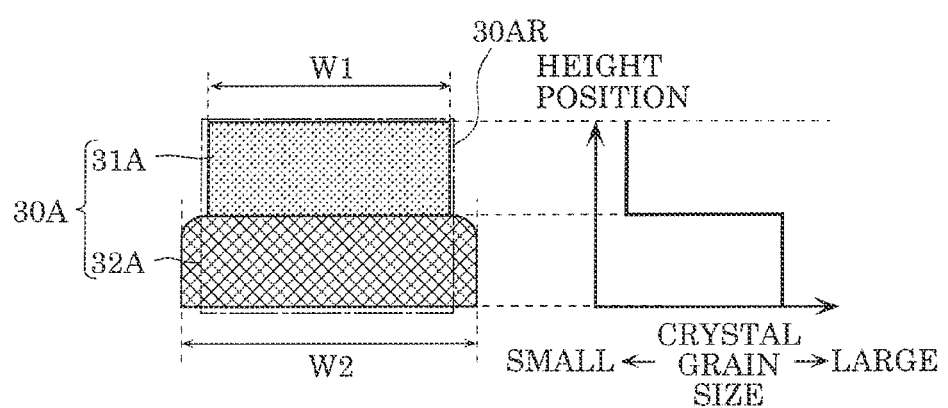
FIG. 19 is an enlarged cross-sectional view of a metal bump of the semiconductor device according to Embodiment 2 and a diagram showing the height position dependence of the crystal grain size in the metal bump.

Next, semiconductor device 1A according to Embodiment 2 will be described with reference to FIGS. 18 and 19. FIG. 18 is a cross-sectional view of semiconductor device 1A according to Embodiment 2. FIG. 19 is an enlarged cross-sectional view of metal bump 30A of semiconductor device 1A and a diagram showing the height position dependence of the crystal grain size in metal bump 30A. In FIG. 19, the vertical axis represents the height of metal bump 30A, and the horizontal axis represents the crystal grain size of metal bump 30A.

As shown in FIG. 18, semiconductor device 1A according to Embodiment 2 includes semiconductor element 10, mounting board 20, and metal bump 30A. Semiconductor element 10 and mounting board 20 are bonded together via metal bumps 30A. In the present embodiment, the configurations of semiconductor element 10 and mounting board 20 are the same as those in Embodiment 1. In addition, in the present embodiment, metal bump 30A includes first layer 31A located on the semiconductor element 10 side and second layer 32A located on the mounting board 20 side similarly to metal bump 30 of Embodiment 1. First layer 31A is in contact with the first electrodes (first p-side electrode 12, first n-side electrode 13) of semiconductor element 10 also in the present embodiment.

Semiconductor device 1A according to the present embodiment differs from semiconductor device 1 according to Embodiment 1 in the configuration of metal bump 30A.

Specifically, first layer 31 has a larger diameter than that of second layer 32 in metal bump 30 of Embodiment 1, but, first layer 31A has a smaller diameter than that of second layer 32A in metal bump 30A of the present embodiment as shown in FIG. 19.

In addition, though the average crystal grain size of the crystals included in first layer 31 is larger than the average crystal grain size of the crystals included in second layer 32 in metal bump 30 of Embodiment 1, the average crystal grain size of the crystals included in second layer 32A is larger than the average crystal grain size of the crystals included in first layer 31A in metal bump 30A of the present embodiment. In other words, first layer 31A located on the semiconductor element 10 side has a smaller average crystal grain size than second layer 32A located on the mounting board 20 side in metal bump 30A of the present embodiment.

In addition, the width of the bonding portion between second layer 32A of metal bump 30A and the second electrodes (second p-side electrode 22, second n-side electrode 23) of mounting board 20 is larger than the width of first layer 31, and the outer shape of metal bump 30A has a wide bottom shape that widens from the semiconductor element 10 side toward the mounting board 20 side.

In this way, since the bonding area between metal bumps 30A and the second electrodes of mounting board 20 is large in semiconductor device 1A having metal bumps 30A whose cross-sectional shape is a wide bottom shape, the bonding strength between metal bumps 30A and mounting board 20 is high. This improves resistance to peeling between metal bumps 30A and the second electrodes (second p-side electrode 22, second n-side electrode 23) of mounting board 20 when thermal stress occurs.

Next, a method for manufacturing semiconductor device 1A according to Embodiment 2 will be described with reference to the drawings.

The method for manufacturing semiconductor device 1A according to Embodiment 2 includes a first step of forming semiconductor stacked structure 11 of semiconductor element 10, a second step of subsequently forming the first electrodes of semiconductor element 10, a third step of subsequently forming gold plating film 30Y as a bump on semiconductor element 10, and a fourth step of subsequently mounting semiconductor element 10 on mounting board 20 by flip chip bonding.

Since the first step and the second step are the same as those in Embodiment 1, the description thereof will be omitted.

In the present embodiment, the third step of forming gold plating film 30Y is performed according to the flow shown in FIGS. 20A to 20D. FIGS. 20A to 20D are diagrams showing a flow for forming gold plating film 30Y in semiconductor element 10.

In the present embodiment, gold plating film 30Y formed as a bump includes a p-side first bump corresponding to first p-side electrode 12 and an n-side second bump corresponding to first n-side electrode 13. The first bump is formed on first p-side electrode 12, and the second bump is formed on first n-side electrode 13. In addition, gold plating film 30Y is a gold plating bump formed by the gold plating method. Specifically, gold plating film 30Y is a gold plating bump having an average crystal grain size of 1 µm or less. Hereinafter, a method for forming gold plating film 30Y will be described.

Figure 20A:
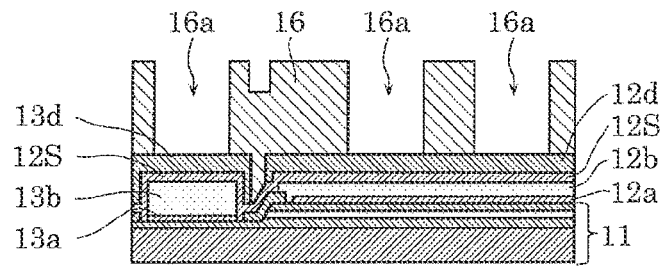
FIG. 20A is a diagram showing a step of forming a resist having openings in the third step of the method for manufacturing the semiconductor device according to Embodiment 2.

After the second step described above, first, a resist for photolithography is applied so as to cover the entire surfaces of cover electrodes 12d and 13d, and the resist is cured by heat treatment at 140° C. for about 20 minutes. Then, as shown in FIG. 20A, openings 16a having a diameter of 25 µm are formed by photolithography in a predetermined region of resist 16 where gold plating film 30Y is formed on each of cover electrode 12d of first p-side electrode 12 and cover electrode 13d of first n-side electrode 13.

Figure 20B:
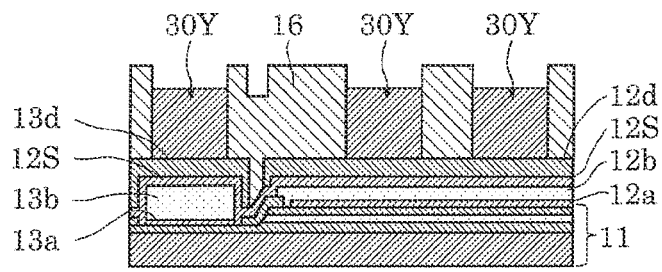
FIG. 20B is a diagram showing a step of forming a gold plating film in the third step of the method for manufacturing the semiconductor device according to Embodiment 2.

Next, as shown in FIG. 20B, gold plating film 30Y is formed by depositing gold in openings 16a of resist 16 by a gold electroplating method. Specifically, gold plating film 30Y is simultaneously formed on each of cover electrode 12d of first p-side electrode 12 and cover electrode 13d of first n-side electrode 13 exposed in openings 16a of resist 16. By using a non-cyan type Au plating solution having a plating solution temperature of 50° C. and setting the deposition rate to 0.5 µm/min as an example of conditions for forming gold plating film 30Y, gold plating film 30Y having a height (thickness) of 5 µm was formed. The crystal structure of gold plating film 30Y just after the formation is an aggregate of fine crystal grains as a whole. It should be noted that gold plating film 30Y formed in this way had an average crystal grain size of 0.8 µm and a hardness of about 1.9 GPa.

Figure 20C:
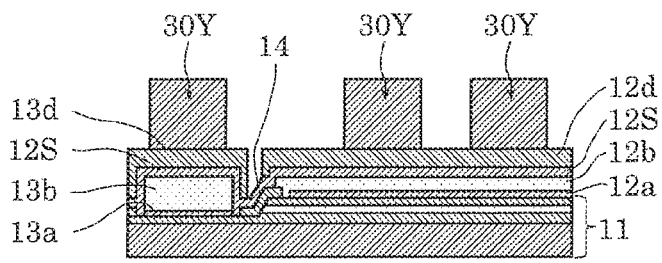
FIG. 20C is a diagram showing a step of removing a resist in the third step of the method for manufacturing the semiconductor device according to Embodiment 2.

Next, as shown in FIG. 20C, resist 16 is removed with an organic solvent. Thereby, cylindrical gold plating film 30Y having a diameter of 25 µm and a height of 5 µm is formed in each predetermined region on cover electrode 12d of first p-side electrode 12 and cover electrode 13d of first n-side electrode 13.

Figure 20D:
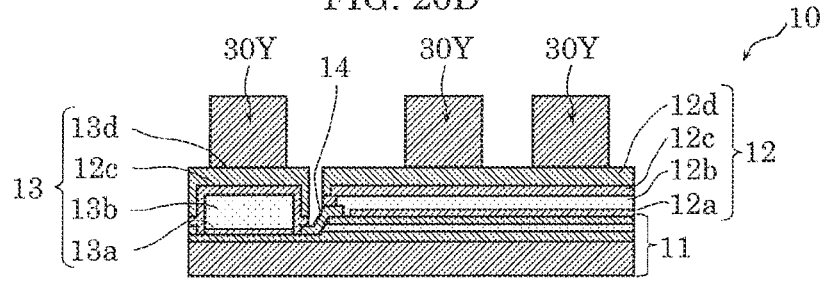
FIG. 20D is a diagram showing a step of removing a part of the seed film and performing p-n separation of the electrode in the third step of the method for manufacturing the semiconductor device according to Embodiment 2.

Next, as shown in FIG. 20D, seed film (Au/Ti) 12S on oxide film 14 between barrier electrode 12b of first p-side electrode 12 and barrier electrode 13b of first n-side electrode 13 is partially removed. Specifically, first, the Au layer that is the upper layer of seed film 12S is removed by an iodine solution, and then the Ti layer that is the lower layer of seed film 12S is removed by dilute hydrofluoric acid to expose oxide film 14. Thereby, seed film 12S can be separated into seed layer 12c and seed layer 13c to perform the p-n separation of the electrodes. In this way, it is possible to form semiconductor element 10 in which the metal bumps comprising the cylindrical gold plating film 30Y having a diameter of 25 µm are formed on first p-side electrode 12 and first n-side electrode 13.

Figure 21A:
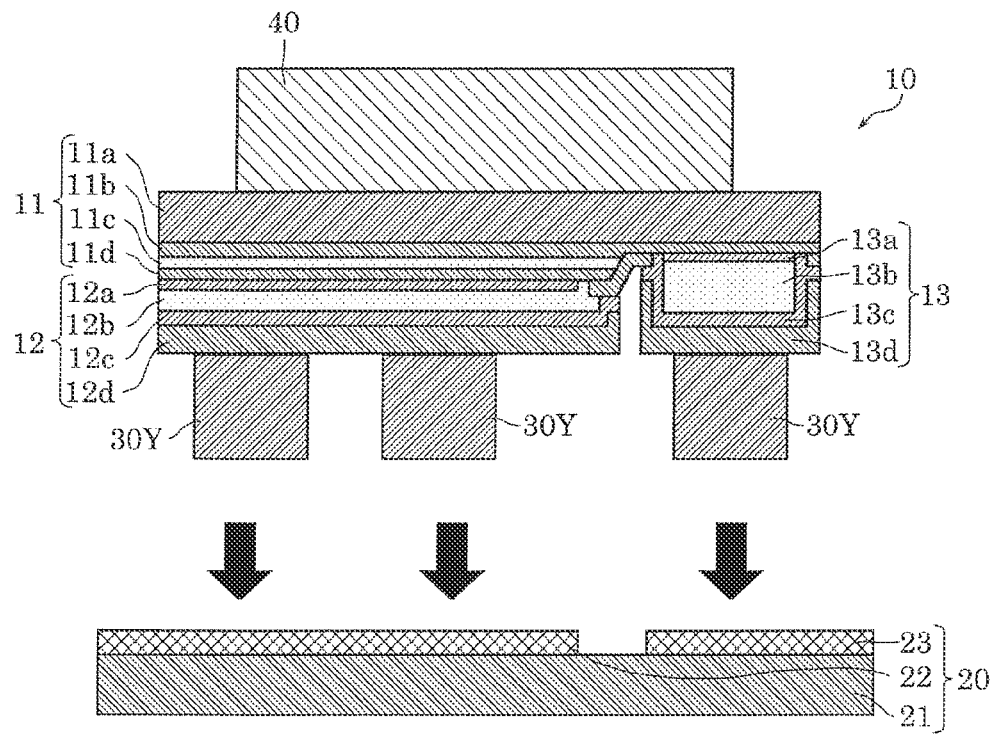
FIG. 21A is a diagram showing a step of disposing a semiconductor element on a mounting board in the fourth step of the method for manufacturing the semiconductor device according to Embodiment 2.
Figure 21B:
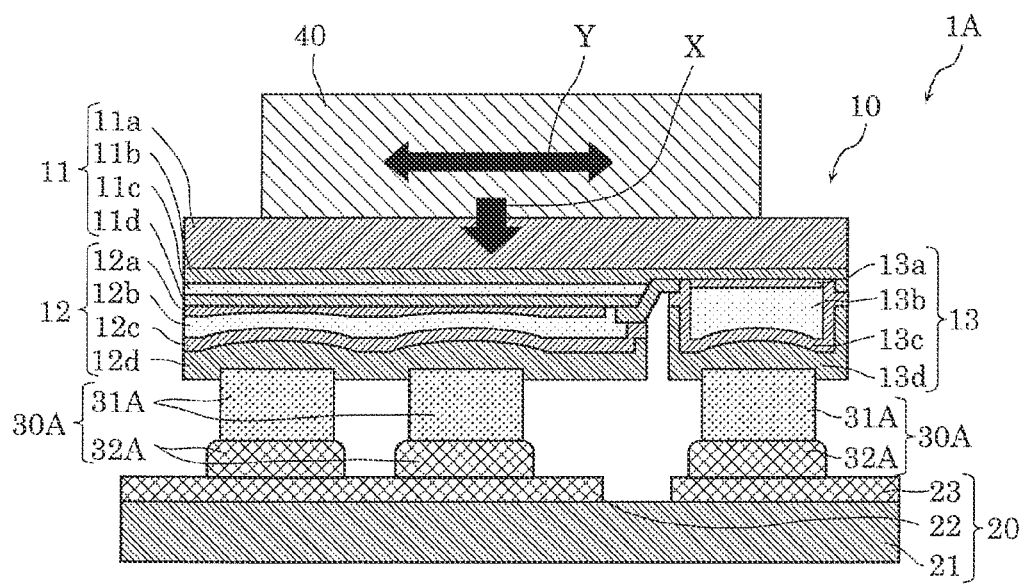
FIG. 21B is a diagram showing a step of mounting a semiconductor element on a mounting board and performing ultrasonic bonding in the fourth step of the method for manufacturing the semiconductor device according to Embodiment 2.

After the third step, a fourth step of mounting semiconductor element 10 on mounting board 20 by flip chip bonding is performed. The fourth step is performed according to the flow shown in FIGS. 21A to 21B. FIGS. 21A to 21B are diagrams showing a flow of mounting semiconductor element 10 on mounting board 20 via gold plating film 30Y.

First, mounting board 20 for mounting semiconductor element 10 is prepared. Specifically, substrate 21 on which second p-side electrode 22 and second n-side electrode 23 were formed was prepared as mounting board 20. In the present embodiment, substrate 21 is a ceramic substrate comprising a sintered body of AlN. In addition, second p-side electrode 22 and second n-side electrode 23 are gold plating films and were formed by using a non-cyan type Au plating solution. It should be noted that a seed layer separated by second p-side electrode 22 and second n-side electrode 23 may be formed between each of second p-side electrode 22 and second n-side electrode 23 and substrate 21.

After that, mounting board 20 on which second p-side electrode 22 and second n-side electrode 23 are formed is subjected to heat treatment at 200° C. for 1 hour in the air atmosphere. Due to this heat treatment, the Au crystal grains included in second p-side electrode 22 and second n-side electrode 23 are coarsened. Thereby, second p-side electrode 22 and second n-side electrode 23 become soft layers. It should be noted that in second p-side electrode 22 and second n-side electrode 23, the grain size of coarsened Au crystal grains was 8 µm.

Then, as shown in FIG. 21A, semiconductor element 10 on which gold plating film 30Y is formed in advance as bumps is prepared, and semiconductor element 10 is vacuum-adsorbed to holding metal tube 40 of the mounting machine so that the gold plating film 30Y side faces mounting board 20. It should be noted that semiconductor element 10 having a size of 800 µm square×100 µm thick is used in the present embodiment.

Next, as shown in FIG. 21B, gold plating film 30Y of semiconductor element 10 and the second electrodes (second p-side electrode 22, second n-side electrode 23) of mounting board 20 are heated to about 200° C. while they are in contact with each other, and while a load of about 30 N is applied to mounting board 20 in the vertical direction (the direction of arrow X in the drawing: first direction) by holding metal tube 40, ultrasonic vibration is applied in the horizontal direction (the direction of arrow Y in the drawing: second direction) relative to mounting board 20 for 300 ms. Thereby, gold plating film 30Y and the second electrodes (second p-side electrode 22, second n-side electrode 23) of mounting board 20 was ultrasonically bonded.

Here, a change that occurs when gold plating film 30Y and the second electrodes of mounting board 20 are bonded by ultrasonic bonding to become metal bump 30A will be described in detail with reference to FIGS. 22 and 23A to 23D.

Figure 22:
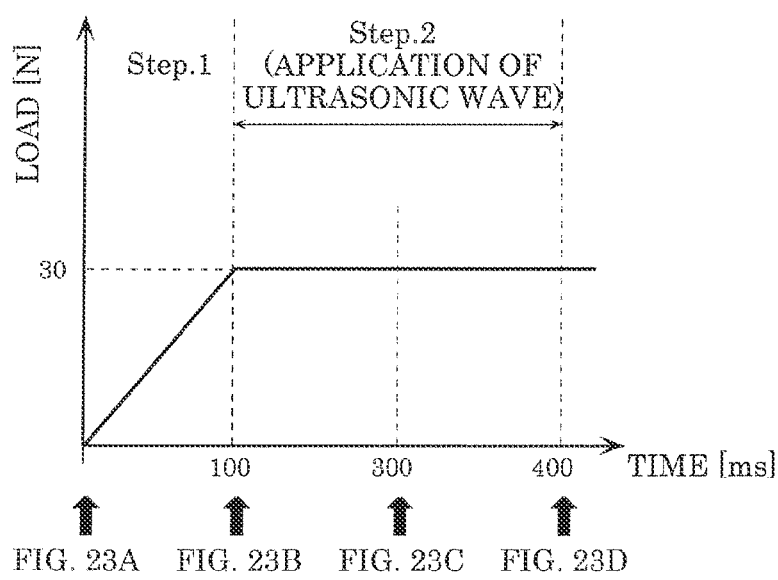
FIG. 22 is a timing chart of ultrasonic bonding when a semiconductor element is mounted on a mounting board according to Embodiment 2.

FIG. 22 is a timing chart of ultrasonic bonding when semiconductor element 10 is mounted on mounting board 20 in Embodiment 2. In FIG. 22, the horizontal axis represents time and the vertical axis represents load. It should be noted that 0 ms is before (or at the start of) the processing, 300 ms corresponds to a time in the middle of processing of the ultrasonic bonding in the present embodiment (the processing time of ultrasonic bonding in Embodiment 1), and 400 ms corresponds to a processing time of ultrasonic bonding in the present embodiment (a processing time obtained by extending the ultrasonic wave application time to the processing time of the ultrasonic bonding in Embodiment 1 by 100 ms).

As shown in FIG. 22, the load is gradually increased during 100 ms (Step 1) after the bonding process between semiconductor element 10 and mounting board 20 is started. In this Step 1, only the load is applied without applying ultrasonic waves. In addition, during 100 ms to 400 ms (Step 2), an ultrasonic wave is applied while keeping the load constant. By performing the bonding process shown in such a timing chart, semiconductor element 10 and mounting board 20 are ultrasonically bonded using gold plating film 30Y as bumps.

In this case, a cross-section of the bonding portion between semiconductor element 10 and mounting board 20 at each time of 0 ms, 100 ms, 300 ms, and 400 ms after starting the bonding process between semiconductor element 10 and mounting board 20, specifically, a cross-section of the bonding portion between gold plating film 30Y and the second electrodes of mounting board 20 is shown in FIGS. 23A to 23D, respectively. It should be noted that in FIGS. 23A to 23D, only the bonding portion on second p-side electrode 22 of the second electrodes of mounting board 20 is shown, but the same applies to the bonding portion on second n-side electrode 23.

Figure 23A:
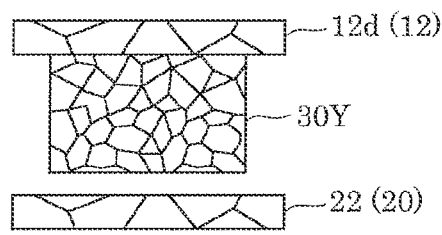
FIG. 23A is a diagram showing a cross-section around a gold plating film before performing ultrasonic bonding according to Embodiment 2.

FIG. 23A shows a cross-section around metal bump 30Y before performing the ultrasonic bonding according to the present embodiment. As shown in FIG. 23A, the Au crystal grains included in gold plating film 30Y have substantially the same diameter, and gold plating film 30Y as a whole has a cylindrical shape with the same diameter.

Figure 23B:
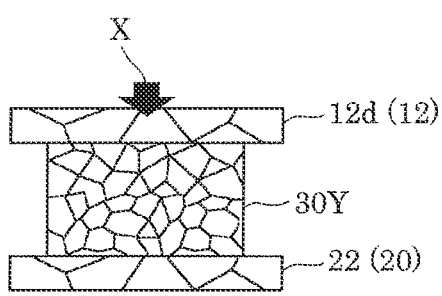
FIG. 23B is a diagram showing a bonding state between the gold plating film and the second electrodes of the mounting board just after Step 1 in FIG. 22.

FIG. 23B shows a bonding state of gold plating film 30Y and the second electrodes of mounting board 20 just after Step 1 in FIG. 22. Specifically, FIG. 23B shows a state after only the load is applied to mounting board 20 in the vertical direction (the direction of arrow X in the drawing). The Au on the surface of the second electrodes of mounting board 20 and the Au of gold plating film 30Y are in a pressure-bonded state, and the boundary of each interface is clearly maintained.

Figure 23C:
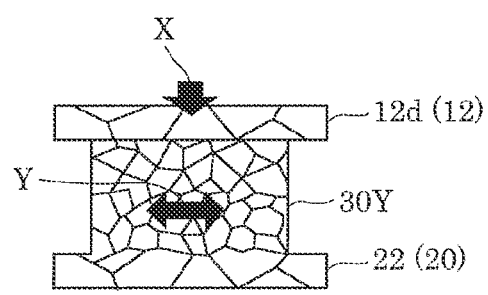
FIG. 23C is a diagram showing a bonding state between the gold plating film and the second electrodes of the mounting board in the middle point of Step 2 (about 300 ms after a process start) in FIG. 22.

FIG. 23C shows a bonding state of gold plating film 30Y and the second electrodes of mounting board 20 in the middle point of Step 2 (about 300 ms after the start of processing and 200 ms after the start of ultrasonic vibration) in FIG. 22. Specifically, FIG. 23C shows a state in which a constant load of 30 N is applied to mounting board 20 in the vertical direction (the direction of arrow X in the drawing), and an ultrasonic wave is applied to apply ultrasonic vibration to mounting board 20 in the horizontal direction (the direction of arrow Y in the drawing) to bond semiconductor element 10 and the second electrodes of mounting board 20.

Thereby, gold plating film 30Y is bonded to the second electrodes of mounting board 20 to form metal bump 30A. That is, by applying the ultrasonic wave, gold plating film 30Y vibrates in the horizontal direction with respect to mounting board 20, the interface where gold plating film 30Y and the second electrodes of mounting board 20 contact with each other is heated by friction, and gold plating film 30Y and the second electrodes of mounting board 20 are solid-phase bonded and integrated with each other. At this time, some of the Au crystal grains of the surface layer of the second electrodes of mounting board 20 and the Au crystal grains of gold plating film 30Y are integrated without maintaining the original shape, and the boundary between gold plating film 30Y and the second electrodes of mounting board 20 is no longer a clear boundary.

Figure 23D:
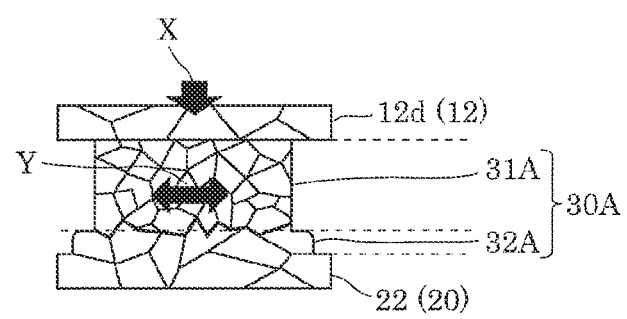
FIG. 23D is a diagram showing a bonding state between the gold plating film and the second electrodes of the mounting board at the end of Step 2 in FIG. 22.

FIG. 23D shows a bonding state between gold plating film 30Y and the second electrodes of mounting board 20 at the end point of Step 2 (about 400 ms after the start of processing and 300 ms after the start of ultrasonic vibration).

In the bonding state of FIG. 23D, the Au crystal grains derived from metal plating film 30Y and the Au crystal grains derived from the second electrodes of mounting board 20 are integrated at the bonding interface between metal bump 30A and the second electrodes of mounting board 20. Then, second layer 32A is formed as a layer in which the Au crystal grains are integrated with each other and the Au crystal grains are coarsened. In addition, a portion of gold plating film 30Y that is not integrated with the Au crystal grains of the second electrodes of mounting board 20 becomes first layer 31A.

Since second layer 32A is formed by coarsening the Au crystal grains, it is soft as a layer. On the other hand, first layer 31A is still hard as a layer because the Au crystal grains are not coarsened.

In addition, since second layer 32A is formed by applying ultrasonic vibration to mounting board 20 in the horizontal direction (the direction of arrow Y in the drawing), second layer 32A spreads laterally more than first layer 31A. As a result, as shown in FIG. 19, metal bump 30A having first layer 31A and second layer 32A is formed in a wide bottom shape spreading to the first layer 31A side.

When the widths of the respective portions of the formed metal bumps 30A were measured, width W1 at the bonding interface between the first electrodes of semiconductor element 10 and first layer 31A was 25 μm, and width W2 at the boding surface between the second electrodes of mounting board 20 and second layer 32A of the second electrodes (the width of second layer 32A) was 30 μm. That is, metal bump 30A has a wide bottom shape spreading to the mounting board 20 side. It should be noted that when the crystal grain size of metal bump 30A was measured, the average crystal grain size of first layer 31A was 0.8 μm, and the average crystal grain size of second layer 32A was 8 μm.

Here, as shown by the alternate long and short dash line in FIG. 19, virtual bump 30AR having a virtual rectangle cross-section having a same area and a same height as a cross-sectional shape of metal bump 30A is virtually defined in the cross-section of semiconductor element 10, mounting board 20, and metal bumps 30A in the direction perpendicular to mounting board 20. Comparing this virtual bump 30AR with metal bump 30A in the present embodiment, width W2 of the second bonding portion which is a bonding portion (bonding interface) between the second electrodes of mounting board 20 and second layer 32A of metal bump 30A is longer than length L of the bottom of virtual bump 30AR. Therefore, metal bump 30A can be expected to have higher bonding strength than virtual bump 30AR having the same cross-sectional area. It should be noted that first layer 31A of metal bump 30A has a width shorter than length L of the bottom of the rectangle of virtual bump 30AR.

Next, the bonding strength of metal bumps 30A in semiconductor device 1A according to Embodiment 2 was measured, which will be described below. Specifically, the strength of the bonding portion between metal bumps 30A and mounting board 20 was measured by shear strength in the same manner as in Embodiment 1.

In order to verify the effect of shear strength, the shear strength of semiconductor device 100 of the comparative example shown in FIG. 29B was confirmed, and it was 5 kgF. On the other hand, the shear strength of semiconductor device 1A according to Embodiment 2 was 8 kgF.

In this way, it is considered that the reason why semiconductor device 1A of Embodiment 2 has a higher shear strength than that of semiconductor device 100 of the comparative example is that metal bumps 30A have a wide bottom shape spreading to the mounting board 20 side to increase the bonding area between metal bumps 30A and mounting board 20.

Specifically, in semiconductor device 100 of the comparative example shown in FIG. 29B, the diameter of the bonding interface between the second electrodes of mounting board 20 and the cylindrical metal bump 130 was 25 μm, whereas in semiconductor device 1A according to the embodiment, the diameter of the bonding interface between the second electrodes of mounting board 20 and metal bump 30A was 30 μm.

In this way, it is considered that since metal bump 30A has a wide bottom shape in which the bonding area with mounting board 20 is increased in semiconductor device 1A according to the present embodiment, the shear strength also increased from 5 kgF to 8 kgF, as the bonding area between metal bump 30A and mounting board 20 was increased.

As described above, semiconductor device 1A according to the present embodiment can obtain the same effects as those of semiconductor device 1 according to Embodiment 1. That is, according to semiconductor device 1A according to the present embodiment, when semiconductor element 10 is mounted on mounting board 20 by flip chip bonding, damage to semiconductor element 10 can be reduced to avoid a short circuit defect caused by the bump mark generated in the first electrodes of semiconductor element 10. Furthermore, the adhesion and the bonding strength between semiconductor element 10 and mounting board 20 can be improved. Thereby, it is possible to improve the defects caused by the bonding of the metal bumps such that the first electrodes and the second electrodes are damaged or peeled off when semiconductor element 10 is mounted on mounting board 20, and the mechanical reliability level can be raised. Therefore, semiconductor device 1A which is excellent in long-term reliability can be obtained.

It should be noted that in the present embodiment, the heat treatment (annealing) is not performed on gold plating film 30Y, but the heat treatment (annealing) may be performed on gold plating film 30Y after forming gold plating film 30Y as in Embodiment 1. Thereby, since both of coarsening the crystal grains of the layer of metal bump 30A on the semiconductor element 10 side and coarsening the crystal grains of the layer of metal bump 30A on the mounting board 20 side is increased due to the longer ultrasonic bonding time as in the present embodiment can be performed, the bonding area of both the upper surface and the lower surface of metal bump 30A can be increased. As a result, the bonding strength between semiconductor element 10 and mounting board 20 can be further increased, so that semiconductor device 1A having even higher bonding strength can be obtained. Therefore, it is possible to obtain semiconductor device 1A having further excellent long-term reliability.

In this case, the layer of the portion in metal bump 30A connected to semiconductor element 10 may be the same as second layer 32 of metal bump 30A in Embodiment 2.

Embodiment 3

Figure 24:
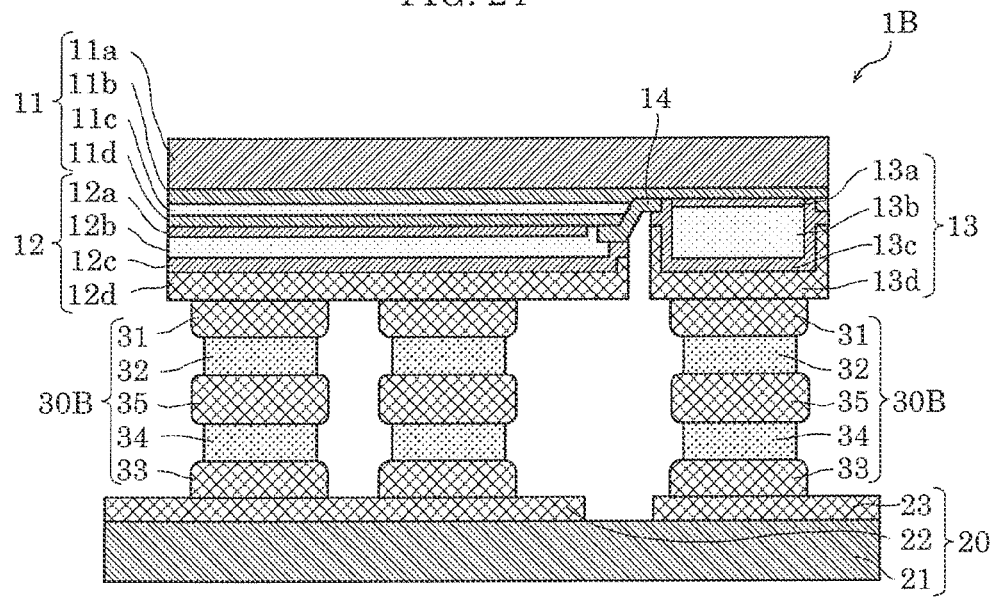
FIG. 24 is a cross-sectional view of a semiconductor device according to Embodiment 3.
Figure 25:
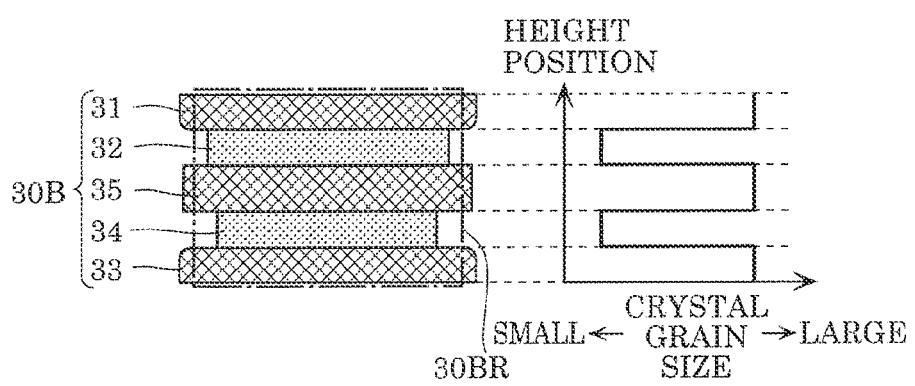
FIG. 25 is an enlarged cross-sectional view of a metal bump of the semiconductor device according to Embodiment 3 and a diagram showing the height position dependence of the crystal grain size in the metal bump.

Next, semiconductor device 1B according to Embodiment 3 will be described with reference to FIGS. 24 and 25. FIG. 24 is a cross-sectional view of semiconductor device 1B according to Embodiment 3. FIG. 25 is an enlarged cross-sectional view of metal bump 30B of semiconductor device 1B and a diagram showing the height position dependence of the crystal grain size in metal bump 30B. In FIG. 25, the vertical axis represents the height of metal bump 30B, and the horizontal axis represents the crystal grain size of metal bump 30B.

As shown in FIG. 24, semiconductor device 1B according to Embodiment 3 includes semiconductor element 10, mounting board 20, and metal bumps 30B. Semiconductor element 10 and mounting board 20 are bonded together via metal bumps 30B. In the present embodiment, the configuration of semiconductor element 10 is the same as that of Embodiment 1.

Semiconductor device 1B according to the present embodiment is different from semiconductor device 1 according to Embodiment 1 in the configuration of metal bump 30B.

Specifically, metal bump 30 in Embodiment 1 includes two layers of first layer 31 having a large diameter and second layer 32 having a small diameter. However, metal bump 30B of the present embodiment includes five layers of first layer 31, second layer 32, fifth layer 35, fourth layer 34, and third layer 33 in order from the semiconductor element 10 side as shown in FIG. 25.

Then, first layer 31, second layer 32, fifth layer 35, fourth layer 34, and third layer 33 all have a substantially cylindrical shape, but the diameters of first layer 31, third layer 33, and fifth layer 35 are larger than the diameters of second layer 32 and fourth layer 34. It should be noted that the diameters of first layer 31, third layer 33, and fifth layer 35 may be the same or different from each other. In addition, the diameters of second layer 32 and fourth layer 34 may be the same or different from each other.

In the present embodiment, first layer 31 is in contact with the first electrodes (first p-side electrode 12, first n-side electrode 13) of semiconductor element 10, and second layer 32 is in contact with first layer 31. In addition, third layer 33 is in contact with the second electrodes (second p-side electrode 22, second n-side electrode 23) of mounting board 20, and fourth layer 34 is in contact with third layer 33. Fifth layer 35 is sandwiched between second layer 32 and fourth layer 34.

In metal bump 30B, the average crystal grain size of the crystals included in first layer 31 is larger than the average crystal grain size of the crystals included in second layer 32. In addition, the average crystal grain size of the crystals included in third layer 33 is larger than the average crystal grain size of the crystals included in fourth layer 34. In addition, the average crystal grain size of the crystals included in fifth layer 35 is larger than the average crystal grain size of the crystals included in each of second layer 32 and fourth layer 34.

In addition, the width of the bonding portion between first layer 31 of metal bump 30B and the first electrodes (first p-side electrode 12, first n-side electrode 13) of semiconductor element 10 is larger than the width of second layer 32, and the outer shape of the semiconductor element 10 side portion of metal bump 30B including first layer 31 and second layer 32 has a wide bottom shape spreading from the mounting board 20 side toward the semiconductor element 10 side.

In addition, the width of the bonding portion between third layer 33 of metal bump 30B and the second electrodes (second p-side electrode 22, second n-side electrode 23) of mounting board 20 is larger than the width of fourth layer 34, and the outer shape of the mounting board 20 side portion of metal bump 30B including third layer 33 and fourth layer 34 has a wide bottom shape spreading from the semiconductor element 10 side toward the mounting board 20 side.

Furthermore, the width of fifth layer 35 between second layer 32 and fourth layer 34 is larger than the width of each of vertically adjacent second layer 32 and fourth layer 34.

In this way, in semiconductor device 1B having metal bumps 30B having a multi-stepped cross-sectional shape, since the bonding area between metal bumps 30B and the second electrodes of mounting board 20 is large, and the bonding area between metal bumps 30B and the first electrodes of semiconductor element 10 is large, the bonding strength between metal bump 30B and each of the first electrodes and the second electrodes is high. Thereby, when thermal stress is generated, the resistance to peeling of metal bumps 30B from semiconductor element 10 and mounting board 20, specifically, peeling of metal bumps 30B from the first electrodes and the second electrodes is improved.

Next, a method for manufacturing semiconductor device 1B according to Embodiment 3 will be described with reference to the drawings.

The method for manufacturing semiconductor device 1B according to Embodiment 3 includes a first step of forming semiconductor stacked structure 11 of semiconductor element 10, a second step of subsequently forming the first electrodes of semiconductor element 10, a third step of subsequently forming metal bumps 30 on semiconductor element 10, and a fourth step of subsequently mounting semiconductor element 10 on mounting board 20 by flip chip bonding.

Since the first step to the third step are the same as those in Embodiment 1, the description thereof will be omitted. In addition, metal bumps 30 on the semiconductor element 10 side are referred to as first metal bumps, and metal bumps 30C on the mounting board 20 side are referred to as second metal bumps.

Before the fourth step of mounting semiconductor element 10 on mounting board 20, first, mounting board 20 on which metal bumps 30C are formed is prepared as mounting board 20 for mounting semiconductor element 10.

A method for manufacturing mounting board 20 on which metal bumps 30C are formed will be described with reference to FIGS. 26A to 26E. FIGS. 26A to 26E are diagrams showing a flow of manufacturing mounting board 20 on which metal bumps 30C are formed.

Figure 26A:
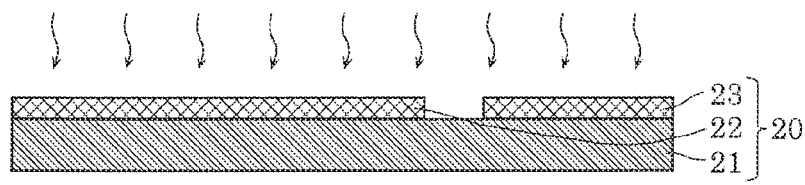
FIG. 26A is a diagram showing a step of forming a second p-side electrode and a second n-side electrode on the mounting board in the mounting board manufacturing steps of a method for manufacturing the semiconductor device according to Embodiment 3.

First, as shown in FIG. 26A, substrate 21 having second p-side electrode 22 and second n-side electrode 23 formed thereon is prepared as mounting board 20. In the present embodiment, substrate 21 is a ceramic substrate comprising a sintered body of AlN. In addition, second p-side electrode 22 and second n-side electrode 23 are gold plating films and are formed by using a non-cyan type Au plating solution. It should be noted that although not shown, a seed layer is formed between each of second p-side electrode 22 and second n-side electrode 23 and substrate 21. The seed layer has, for example, a stacked structure of an upper Au layer and a lower Ti layer.

Next, substrate 21 on which second p-side electrode 22 and second n-side electrode 23 are formed is subjected to heat treatment at 200° C. for 1 hour in the air atmosphere. Due to this heat treatment, the Au crystal grains included in second p-side electrode 22 and second n-side electrode 23 are coarsened. Thereby, second p-side electrode 22 and second n-side electrode 23 become soft layers. It should be noted that in second p-side electrode 22 and second n-side electrode 23, the grain size of coarsened Au crystal grains was 8 μm.

Figure 26B:
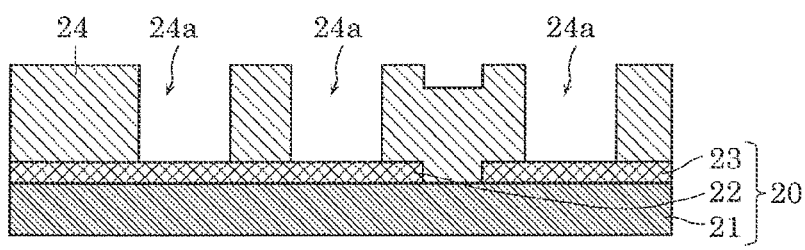
FIG. 26B is a diagram showing a step of forming a resist having openings in the mounting board manufacturing steps of a method for manufacturing the semiconductor device according to Embodiment 3.

Next, a resist for photolithography is applied so as to cover the entire surfaces of second p-side electrode 22 and second n-side electrode 23, and the resist is cured by heat treatment at 140° C. for about 20 minutes. Then, as shown in FIG. 26B, openings 24a having a diameter of 25 μm are formed by photolithography in a predetermined region of resist 24 where metal bumps 30C (the second metal bump) on second p-side electrode 22 and second n-side electrode 23 are formed.

Figure 26C:
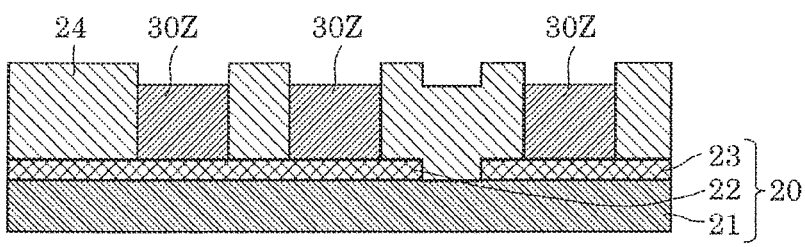
FIG. 26C is a diagram showing a step of forming a gold plating film in the mounting board manufacturing steps of a method for manufacturing the semiconductor device according to Embodiment 3.

Next, as shown in FIG. 26C, gold plating film 30Z to be metal bumps 30C is formed by depositing gold in openings 24a of resist 24 with a gold electroplating method. Specifically, gold plating film 30Z is simultaneously formed on each of second p-side electrode 22 and second n-side electrode 23 exposed in opening 24a of the resist 24. By using a non-cyan type Au plating solution having a plating solution temperature of 50° C. and setting the deposition rate to 0.5 μm/min as an example of conditions for forming gold plating film 30Z, gold plating film 30Z having a height (thickness) of 5 μm was formed. The crystal structure of gold plating film 30Z just after the formation is an aggregate of fine crystal grains as a whole.

Figure 26D:
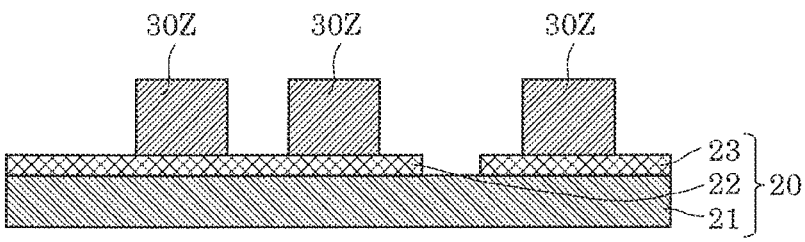
FIG. 26D is a diagram showing a step of removing a resist in the mounting board manufacturing steps of a method for manufacturing the semiconductor device according to Embodiment 3.

Next, as shown in FIG. 26D, resist 24 is removed with an organic solvent. Thereby, cylindrical metal bump 30C having a diameter of 25 μm and a height of 5 μm is formed in each predetermined region on second p-side electrode 22 and second n-side electrode 23.

Then, although not shown, the seed layer on substrate 21 between second p-side electrode 22 and second n-side electrode 23 is partially removed. In the present embodiment, since the seed layer has a stacked structure of an Au layer and a Ti layer, first, the Au layer which is the upper layer of the seed layer is removed by an iodine solution, and then the Ti layer which is the lower layer of the seed layer is removed with diluted hydrofluoric acid to expose substrate 21. Thereby, the seed layer can be separated to perform p-n separation of second p-side electrode 22 and second n-side electrode 23.

Figure 26E:
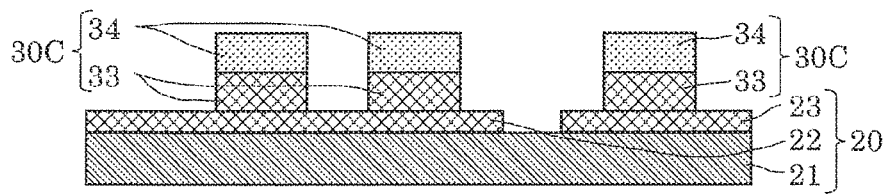
FIG. 26E is a diagram showing a step of performing a heat treatment step in the mounting board manufacturing steps of a method for manufacturing the semiconductor device according to Embodiment 3.

Next, as shown in FIG. 26E, mounting board 20 on which gold plating film 30Z is formed is subjected to heat treatment at 150° C. for 1 hour in the air atmosphere. By this heat treatment, the crystal grain size of gold plating film 30Z changes, and it is possible to obtain metal bumps 30C including the two layers of third layer 33 and fourth layer 34 having the same composition but different crystal grain sizes. In metal bumps 30C, third layer 33 on the side closer to substrate 21 has a larger crystal grain size than fourth layer 34 on the side farther from substrate 21.

Figure 27A:
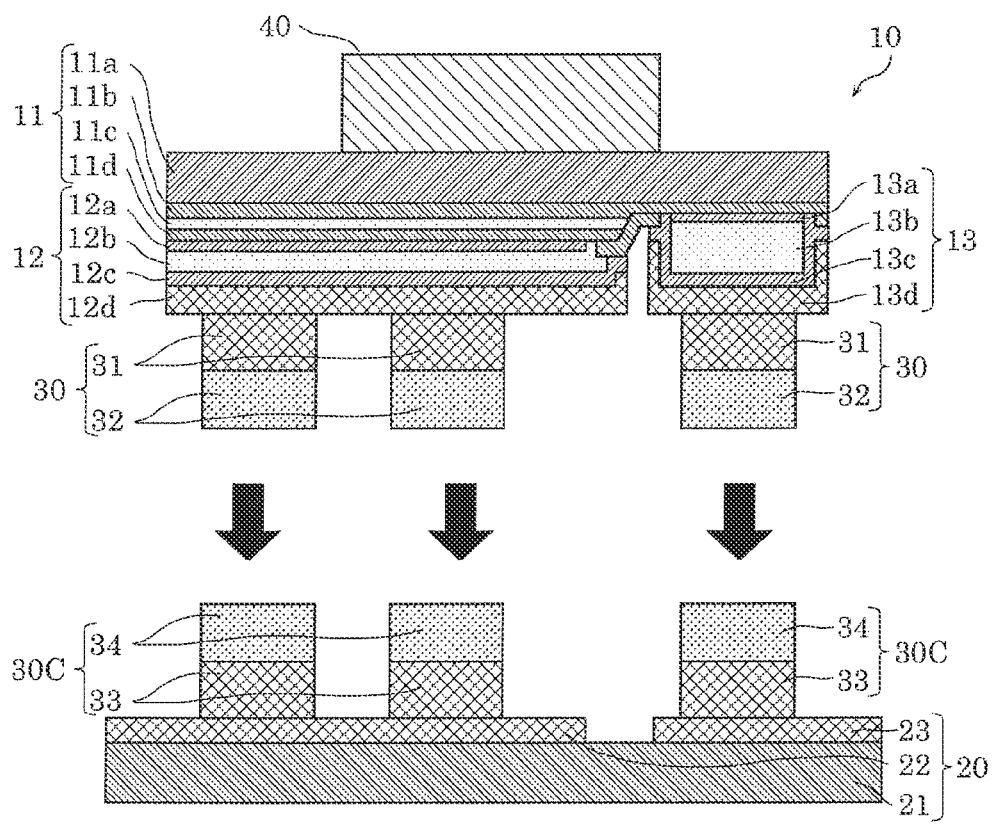
FIG. 27A is a diagram showing a step of disposing the semiconductor element on the mounting board in the fourth step of the method for manufacturing the semiconductor device according to Embodiment 3.
Figure 27B:
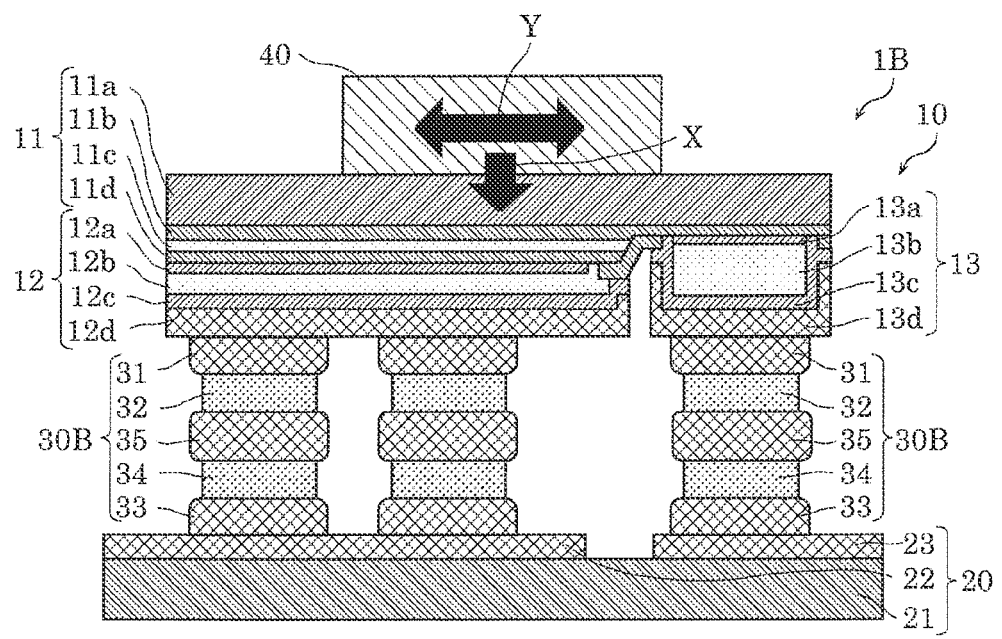
FIG. 27B is a diagram showing a step of mounting the semiconductor element on the mounting board and performing ultrasonic bonding in the fourth step of the method for manufacturing the semiconductor device according to Embodiment 3.

Next, according to the flow shown in FIGS. 27A and 27B, semiconductor element 10 is mounted on mounting board 20 by flip chip bonding via metal bumps 30 and 35. FIGS. 27A to 27B are diagrams showing a flow of mounting semiconductor element 10 on mounting board 20 via metal bumps 30 and 30C.

First, as shown in FIG. 27A, semiconductor element 10 on which metal bumps 30 are formed in advance is vacuum-adsorbed to holding metal tube 40 of the mounting machine. At this time, semiconductor element 10 is vacuum-adsorbed to holding metal tube 40 so that metal bumps 30 (first metal bumps) formed on semiconductor element 10 and metal bumps 30C (second metal bumps) formed on mounting board 20 are faced to each other. It should be noted that semiconductor element 10 having a size of 800 μm square× 100 μm thick is used in the present embodiment.

Next, as shown in FIG. 27B, second layer 32 of metal bumps 30 formed in semiconductor element 10 and fourth layer 34 of metal bumps 30C formed on mounting board 20 are heated to about 200° C. while they are brought into contact with each other, and while a load of about 30 N is applied to mounting board 20 in the vertical direction (the direction of arrow X in the drawing: first direction) by holding metal tube 40, ultrasonic vibration is applied in the horizontal direction (the direction of arrow Y in the drawing: second direction) relative to mounting board 20 for 300 ms. Thereby, second layer 32 of metal bumps 30 formed in semiconductor element 10 and fourth layer 34 of metal bumps 30C formed on mounting board 20 was ultrasonically bonded.

At this time, at the bonding interface between second layer 32 of metal bump 30 of semiconductor element 10 and fourth layer 34 of metal bump 30C of mounting board 20, Au crystal grains of second layer 32 and fourth layer 34 are integrated with each other. Then, fifth layer 35 is formed as a layer in which both Au crystal grains are integrated and the Au crystal grains are coarsened. Since fifth layer 35 is formed by coarsening the Au crystal grains, it is soft as a layer.

In addition, since fifth layer 35 is formed by applying ultrasonic vibration to mounting board 20 in the horizontal direction (the direction of arrow Y in the drawing), fifth layer 35 spreads laterally more than second layer 32 and fourth layer 34. That is, the width of fifth layer 35 is larger than the width of second layer 32 and the width of fourth layer 34. Thereby, metal bumps 30B having a multi-stepped shape that connect semiconductor element 10 and mounting board 20 are formed.

When the widths of the respective portions of the formed metal bumps 30B were measured, the width at the bonding interface between the first electrodes and first layer 31 formed in semiconductor element 10 was 30 μm, the width of second layer 32 was 25 μm, the width at the bonding interface between the second electrodes formed on mounting board 20 and third layer 33 was 30 μm, the width of fourth layer 34 was 25 μm, and the width of fifth layer 35 was 28 μm.

Metal bumps 30B formed in this way have a wide bottom shape spreading to both the semiconductor element 10 side and the mounting board 20 side, and fifth layer 35, which forms a bonding portion between metal bumps 30 formed on semiconductor element 10 and metal bump 30C formed on mounting board 20, also has a wider shape than second layer 32 and fourth layer 34.

It should be noted that the thickness of each portion of metal bump 30B was 1 μm for first layer 31, 2 μm for second layer 32, 1 μm for third layer 33, 2 μm for fourth layer 34, and 2 μm for fifth layer 35.

Here, as shown by the alternate long and short dash line in FIG. 25, when virtual bump 30BR having a virtual rectangle cross-section having a same area and a same height as a cross-sectional shape of metal bump 30B is virtually defined in the cross-section of semiconductor element 10, mounting board 20, and metal bumps 30B in the direction perpendicular to mounting board 20, length L of the bottom of the rectangle of virtual bump 30BR is 27 μm. Comparing this virtual bump 30BR with metal bump 30B in the present embodiment, width of the first bonding portion which is a bonding portion (bonding interface) between the first electrodes of semiconductor element 10 and first layer 31 of metal bump 30B is longer than length L of the bottom of virtual bump 30BR. Furthermore, the width of the second bonding portion which is a bonding portion between the second electrodes of mounting board 20 and third layer 33 of metal bump 30B is longer than length L of the bottom of the rectangle of the virtual bump 30BR. Therefore, metal bump 30B can be expected to have higher bonding strength than virtual bump 30BR having the same cross-sectional area. It should be noted that second layer 32 and fourth layer 34 of metal bump 30B have widths shorter than length L of the bottom of the rectangle of virtual bump 30BR.

Next, the bonding strength of metal bumps 30B on semiconductor device 1B according to Embodiment 3 was measured, which will be described below. Specifically, the strength of the bonding portion between metal bump 30B and mounting board 20 was measured by shear strength in the same manner as in Embodiment 1.

As a result, the shear strength of semiconductor device 1B according to the present embodiment was 8 kgF. It should be noted that since semiconductor device 100 of the comparative example shown in FIG. 29B has a shear strength of 5 kgF, it has been found that semiconductor device 1B according to the present embodiment has an increased shear strength as compared with semiconductor device 100 of the comparative example.

In this way, it is thought that the reason why semiconductor device 1B of Embodiment 3 has a higher shear strength than semiconductor device 100 of the comparative example is that the bonding area of each bonding portion where peeling easily occurs was increased by that metal bumps 30B have a wide bottom shape spreading to both the mounting board 20 side and the semiconductor element 10 side, and that fifth layer 35 forming the bonding portion between metal bump 30 formed on semiconductor element 10 and metal bump 30C formed on mounting board 20 also has a spreading shape.

In this way, the improvement in the bonding strength of metal bumps 30B leads to the improvement in resistance to electrode peeling when thermal stress occurs. Therefore, semiconductor device 1B according to the present embodiment is particularly suitable as a light source for vehicle-mounted application, in which it is expected that stress problems due to heat generation will become apparent in the future because semiconductor elements such as LEDs are downsized, increased in current, and integrated.

As described above, semiconductor device 1B according to the present embodiment can obtain the same effects as those of semiconductor device 1 according to Embodiment 1 described above. That is, according to semiconductor device 1B according to the present embodiment, when semiconductor element 10 is mounted on mounting board 20 by flip-chip bonding, damage to semiconductor element 10 can be reduced to avoid a short circuit defect caused by the bump mark generated in the first electrodes of semiconductor element 10. Furthermore, the adhesion and the bonding strength between semiconductor element 10 and mounting board 20 can be improved. Thereby, it is possible to improve the defects caused by the bonding of the metal bumps such that the first electrodes and the second electrodes are damaged or peeled off when semiconductor element 10 is mounted on mounting board 20, and the mechanical reliability level can be raised. Therefore, semiconductor device 1B which is excellent in long-term reliability can be obtained.

(Variations)

Although the semiconductor device according to the present disclosure has been described above based on Embodiments 1 to 3, the present disclosure is not limited to each of the embodiments described above.

For example, the LED chip is exemplified as semiconductor element 10 in each of the embodiments described above, but semiconductor element 10 is not limited thereto and may be another solid-state light emitting element such as a laser element. In addition, semiconductor element 10 is not limited to the light emitting element. For example, semiconductor element 10 may be a power semiconductor element such as a compound field effect transistor such as GaN and SiC.

It should be noted that forms obtained by applying various modifications that those skilled in the art can conceive to the respective embodiments described above, and forms realized by arbitrarily combining the components and functions in the respective embodiments within the scope without departing from the spirit of the present disclosure are also included in the present disclosure.

INDUSTRIAL APPLICABILITY

The semiconductor device according to the present disclosure has excellent long-term reliability and is useful for various devices such as vehicle-mounted applications.

The invention claimed is:

1. A semiconductor device, comprising:
a mounting board; and
a semiconductor element disposed on the mounting board via a metal bump, wherein:
the semiconductor element includes a semiconductor stacked structure and a first electrode,
the mounting board includes a second electrode,
the first electrode includes a stacked structure including a barrier electrode,
the metal bump disposed at a position where the metal bump overlaps the barrier electrode in a thickness direction is a member integrated in a single piece, the single piece including a second layer bonded to and in contact with the second electrode, a first layer located on a side opposite to the second electrode, and a transition region located between the first layer and the second layer,
an average crystal grain size of crystals included in the second layer is larger than an average crystal grain size of crystals included in the first layer,
an average crystal grain size in the transition region approaches from the average crystal grain size of the first layer to the average crystal grain size of the second layer,
the first layer is spaced apart from the second electrode, and
the first layer has a smaller width than that of the second layer in a cross-section passing through a center of the metal bump.

2. The semiconductor device according to claim 1, wherein:
the metal bump comprises gold, and
the semiconductor stacked structure includes: a substrate; and a first conductive type semiconductor layer, an active layer, and a second conductive type semiconductor layer, which are sequentially stacked in order from a side of the substrate.

3. The semiconductor device according to claim 1, wherein:
the metal bump comprises gold, and
when S denotes a cross-sectional area of the metal bump and H denotes a height of the metal bump in a cross-section of the semiconductor element, the mounting board, and the metal bump in a direction perpendicular to the mounting board,
a width of a second bonding portion which is a bonding portion between the second electrode and the second layer in contact with the second electrode is longer than S/H.

4. The semiconductor device according to claim 3, wherein
the first layer has a width shorter than the S/H.

5. The semiconductor device according to claim 1, wherein:
the metal bump comprises gold, and
a bonding interface between the second layer and the second electrode is integrated.

6. The semiconductor device according to claim 2, wherein
the first electrode is disposed in contact with the second conductive type semiconductor layer, and includes a metal film that reflects light from the active layer.

7. The semiconductor device according to claim 1, wherein:
the metal bump comprises gold, and
the barrier electrode comprises Ti.

8. The semiconductor device according to claim 1, wherein:
the metal bump comprises gold, and
the mounting board is a ceramic board comprising a sintered body of AlN.

9. The semiconductor device according to claim 1, wherein:
the metal bump comprises gold, and
the second layer has a thickness of at least 1 µm.

10. The semiconductor device according to claim 1, wherein
the semiconductor stacked structure includes: a substrate; and a first conductive type semiconductor layer, an active layer, and a second conductive type semiconductor layer, which are sequentially stacked in order from a side of the substrate.

11. The semiconductor device according to claim 1, wherein
when S denotes a cross-sectional area of the metal bump and H denotes a height of the metal bump in a cross-section of the semiconductor element, the mounting board, and the metal bump in a direction perpendicular to the mounting board, a width of a second bonding portion which is a bonding portion between the second electrode and the second layer in contact with the second electrode is longer than S/H.

12. The semiconductor device according to claim 11, wherein
the first layer has a width shorter than the S/H.

13. The semiconductor device according to claim 1, wherein
a bonding interface between the second layer and the second electrode is integrated.

14. The semiconductor device according to claim 10, wherein
the first electrode is disposed in contact with the second conductive type semiconductor layer, and includes a metal film that reflects light from the active layer.

15. The semiconductor device according to claim 1, wherein
the barrier electrode comprises Ti.

16. The semiconductor device according to claim 1, wherein
the mounting board is a ceramic board comprising a sintered body of AlN.

17. The semiconductor device according to claim 1, wherein
the second layer has a thickness of at least 1 μm.

18. The semiconductor device according to claim 1, wherein the metal bump comprises a gold plating layer.

* * * * *